(12) United States Patent
Dasaka et al.

(10) Patent No.: US 9,240,482 B2
(45) Date of Patent: Jan. 19, 2016

(54) ASYMMETRIC STRESSOR DRAM

(71) Applicant: GLOBALFOUNDRIES INC., Grand Cayman (KY)

(72) Inventors: Ravi K. Dasaka, Danbury, CT (US); Shreesh Narasimha, Beacon, NY (US); Ahmed Nayaz Noemaun, Beacon, NY (US); Karen A. Nummy, Newburgh, NY (US); Katsunori Onishi, Fishkill, NY (US); Paul C. Parries, Beacon, NY (US); Chengwen Pei, Danbury, CT (US); Geng Wang, Stormville, NY (US); Bidan Zhang, Beacon, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/476,897

(22) Filed: Sep. 4, 2014

(65) Prior Publication Data

US 2015/0349121 A1 Dec. 3, 2015

Related U.S. Application Data

(63) Continuation-in-part of application No. 14/291,094, filed on May 30, 2014.

(51) Int. Cl.
*H01L 21/00* (2006.01)
*H01L 29/78* (2006.01)
*H01L 27/108* (2006.01)

(52) U.S. Cl.
CPC ...... *H01L 29/7848* (2013.01); *H01L 27/10829* (2013.01); *H01L 27/10867* (2013.01); *H01L 27/10873* (2013.01)

(58) Field of Classification Search
None
See application file for complete search history.

(56) References Cited

U.S. PATENT DOCUMENTS

| 8,242,549 | B2 | 8/2012 | Booth, Jr. et al. |
| 8,604,551 | B2 | 12/2013 | Hyun et al. |
| 2006/0138477 | A1 | 6/2006 | Suh |
| 2010/0207175 | A1* | 8/2010 | Suryagandh ...... H01L 29/66636 257/288 |
| 2011/0254015 | A1 | 10/2011 | Doris et al. |
| 2012/0104476 | A1 | 5/2012 | Sandhu et al. |
| 2012/0129311 | A1 | 5/2012 | Pal et al. |

* cited by examiner

*Primary Examiner* — Richard Booth
(74) *Attorney, Agent, or Firm* — Scully, Scott, Murphy & Presser, P.C.

(57) ABSTRACT

A stressor structure is formed within a drain region of an access transistor in a dynamic random access memory (DRAM) cell in a semiconductor-on-insulator (SOI) substrate without forming any stressor structure in a source region of the DRAM cell. The stressor structure induces a stress gradient within the body region of the access transistor, which induces a greater leakage current at the body-drain junction than at the body-source junction. The body potential of the access transistor has a stronger coupling to the drain voltage than to the source voltage. An asymmetric etch of a gate dielectric cap, application of a planarization material layer, and a non-selective etch of the planarization material layer and the gate dielectric cap can be employed to form the DRAM cell.

20 Claims, 21 Drawing Sheets

US 9,240,482 B2

ASYMMETRIC STRESSOR DRAM

BACKGROUND

The present disclosure relates to a dynamic random access memory (DRAM) structure, and particularly to a DRAM structure including an asymmetric stressor and a method of manufacturing the same.

Generally, low leakage current is desirable in a DRAM cell in order to provide long retention time for the electrical charge stored in a capacitor. However, in the case of a DRAM cell formed on a semiconductor-on-insulator (SOI) substrate, excessively low leakage current can induce a floating body potential problem in which the voltage of the body of an access transistor is not predictable, and thus, the threshold voltage of the access transistor becomes unstable.

SUMMARY

A stressor structure is formed within a contact region of an access transistor in a dynamic random access memory (DRAM) cell in a semiconductor-on-insulator (SOI) substrate without forming any stressor structure in a deep trench (DT) capacitor region of the DRAM cell. The stressor structure induces a stress gradient within the body region of the access transistor, which induces a greater leakage current at the body-drain junction (on the contact side) than at the body-source junction (on DT side). The body potential of the access transistor has a stronger coupling to the drain voltage than to the source voltage. The asymmetric stress enables low leakage current for the body region during charge storage while the drain voltage is low, and enables a body potential coupled to the drain region and a lower threshold voltage for the access transistor during read and write operations. An asymmetric etch of a gate dielectric cap, application of a planarization material layer, and a non-selective etch of the planarization material layer and the gate dielectric cap can be employed to form the DRAM cell.

According to an aspect of the present disclosure, a semiconductor structure includes a trench capacitor embedded within a semiconductor substrate, and an access field effect transistor including a source region and a drain region. The source region is electrically shorted to an inner electrode of the trench capacitor. The semiconductor structure further includes a stressor structure embedded within the drain region, the stressor structure generating asymmetric stress across a body region of the access field effect transistor.

According to another aspect of the present disclosure, a method of forming a semiconductor structure is provided. A capacitor is formed in a semiconductor substrate. An access transistor is formed on the semiconductor substrate. A source region of the access transistor is electrically shorted to an inner electrode of the capacitor. A stressor structure is formed within a drain region of the access transistor. The stressor structure generates asymmetric stress across a body region of the access field effect transistor.

DETAILED DESCRIPTION

Figure 1:
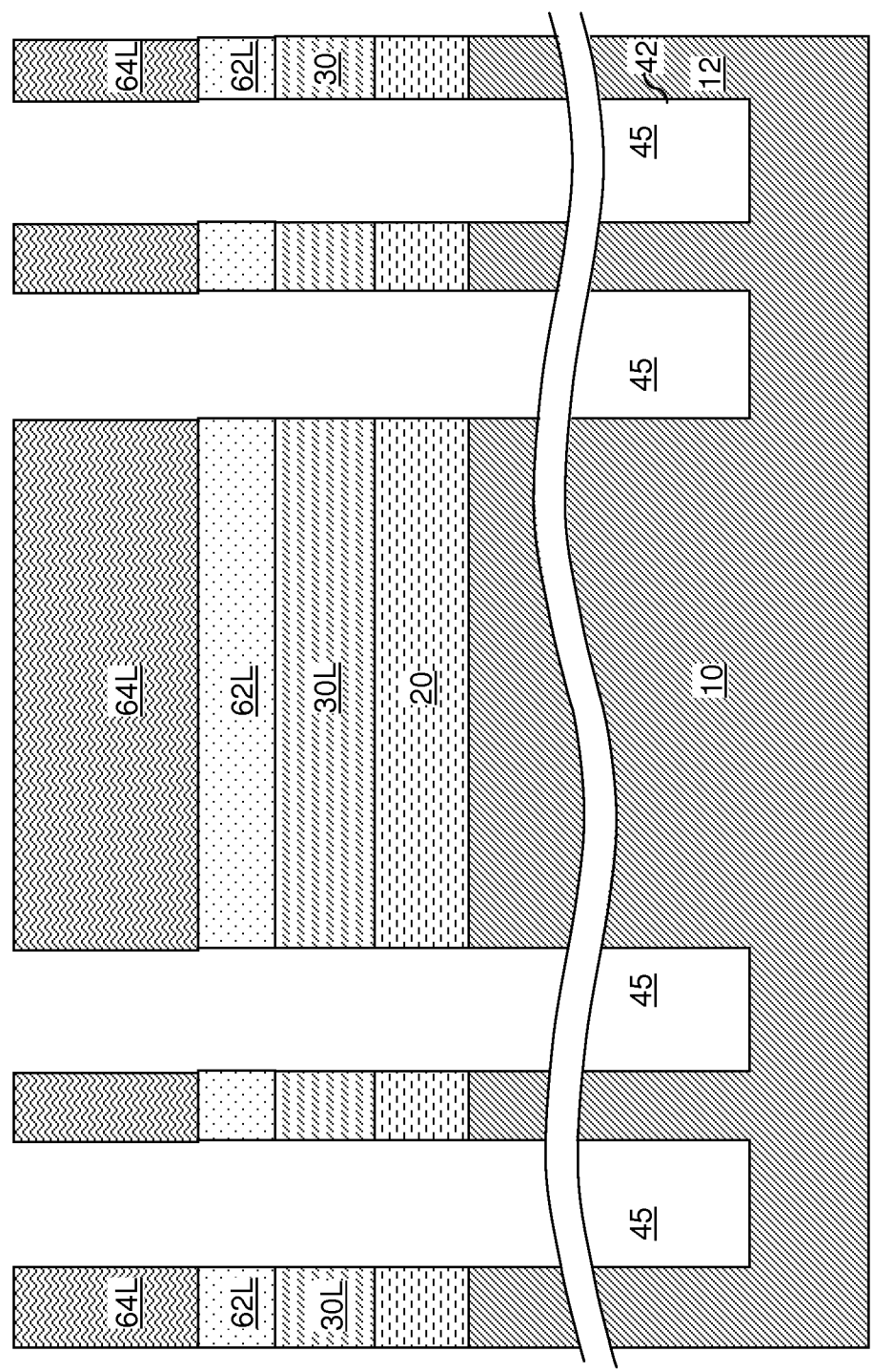
FIG. 1 is a vertical cross-sectional view of an exemplary semiconductor structure after formation of deep trenches according to an embodiment of the present disclosure.

As stated above, the present disclosure relates to a dynamic random access memory (DRAM) structure, and particularly to a DRAM structure including an asymmetric stressor and a method of manufacturing the same. These aspects of the present disclosure are now described in detail with accompanying figures. It is noted that like reference numerals refer to like elements across different embodiments. The drawings are not necessarily drawn to scale. As used herein, ordinals such as "first" and "second" are employed merely to distinguish similar elements, and different ordinals may be employed to designate a same element in the specification and/or claims.

Referring to FIG. 1, an exemplary semiconductor structure according to an embodiment of the present disclosure includes a semiconductor-on-insulator (SOI) substrate. The SOI substrate as provided includes a stack, from bottom to top, of a bottom semiconductor layer 10, a buried insulator layer 20, and a top semiconductor layer 30L. Each of the bottom semiconductor layer 10, the buried insulator layer 20, and the top semiconductor layer 30L can be provided as an unpatterned layer, i.e., a blanket layer having the same thickness throughout.

The bottom semiconductor layer 10 includes a semiconductor material. The buried insulator layer 20 includes a dielectric material such as silicon oxide, silicon nitride, a dielectric metal oxide, or a combination thereof. The top semiconductor layer 30L includes a semiconductor material, which can be the same as, or different from, the semiconductor material of the bottom semiconductor layer 10. The semiconductor material of the top semiconductor layer 30L is herein referred to as a first semiconductor material.

Each of the bottom semiconductor layer 10 and the top semiconductor layer 30L includes a semiconductor material independently selected from elemental semiconductor materials (e.g., silicon, germanium, carbon, or alloys thereof), III-V semiconductor materials, or II-VI semiconductor materials. Each semiconductor material for the bottom semiconductor layer 10 and the top semiconductor layer 30L can be independently single crystalline, polycrystalline, or amorphous. In one embodiment, the bottom semiconductor layer 10 and the top semiconductor layer 30L are single crystalline. In one embodiment, the bottom semiconductor layer 10 and the top semiconductor layer 30L include single crystalline silicon.

In one embodiment, the bottom semiconductor layer 10 can be doped with dopants of a first conductivity type. The first conductivity type can be p-type or n-type.

In one embodiment, the thickness of the top semiconductor layer 30L can be from 5 nm to 300 nm, the thickness of the buried insulator layer 20 can be from 20 nm to 1,000 nm, and the thickness of the bottom semiconductor layer 10 can be from 50 microns to 2 mm, although lesser and greater thicknesses can also be employed for each of these layers (10, 20, 30L).

At least one dielectric pad layer 62L and a trench etch mask layer 64L can be deposited on the SOI substrate (10, 20, 30L), for example, by chemical vapor deposition (CVD) or atomic layer deposition (ALD). The at least one dielectric pad layer 62L includes at least one dielectric layer that can be employed as a stopping layer for planarization purposes. The trench etch mask layer 64L can include one or more layers that can be employed as an etch mask for forming deep trenches 45 in the SOI substrate (10, 20, 30L). As used herein, a "deep trench" refers to a trench that extends from a topmost surface of a semiconductor-on-insulator (SOI) substrate through a top semiconductor layer and a buried insulator layer and partly into an underlying semiconductor layer.

In one embodiment the at least one dielectric pad layer 62L can include a dielectric material such as silicon nitride, a dielectric metal nitride, a doped silicon undoped silicon oxide, a dielectric metal oxide, or a stack thereof. In one embodiment, the thickness of the at least one dielectric pad layer 62L can be from 40 nm to 200 nm, although lesser and greater thicknesses can also be employed. The trench etch mask layer 64L can include, for example, borosilicate glass. The thickness of the trench etch mask layer 64L can be from 400 nm to 2,000 nm, although lesser and greater thicknesses can also be employed.

A photoresist layer (not shown) can be applied over the at least one dielectric pad layer 62L, and can be lithographically patterned to form openings having areas of deep trenches 45 to be subsequently formed. As used herein, a deep trench 45 refers to a trench that extends below the bottom surface of a buried insulator layer. The pattern in the photoresist layer can be transferred into the at least one dielectric pad layer 62L. Subsequently, the pattern in the at least one dielectric pad layer 62L can be transferred through the top semiconductor layer 30L, the buried insulator layer 20, and an upper portion of the bottom semiconductor layer 10 by an anisotropic etch that employs the at least one dielectric pad layer 62L as an etch mask. Deep trenches 45 can be formed for each opening in the at least one dielectric pad layer 62L. The photoresist can be removed by ashing, or can be consumed during the etch process that forms the deep trenches 45. Any remaining portion of the trench etch mask layer 64 can be subsequently removed selective to the at least one dielectric pad layer 62L.

The sidewalls of the deep trenches 45 can be substantially vertically coincident among the various layers (62L, 30L, 20, 10) through which the deep trenches 45 extend. As used herein, sidewalls of multiple elements are "vertically coincident" if the sidewalls of the multiple elements overlap in a top-down view. As used herein, sidewalls of multiple elements are "substantially vertically coincident" if the lateral offset of the sidewalls of the multiple elements from a perfectly vertical surface is within 5 nm. The depth of the deep trenches 45, as measured from the plane of the topmost surface of the SOI substrate (10, 20, 30L) to the bottom surface of the deep trenches 45, can be from 500 nm to 10 microns, although lesser and greater depths can also be employed. The lateral dimensions of each deep trench 45 can be limited by the lithographic capabilities, i.e., the ability of a lithographic tool to print the image of an opening on the photoresist layer. In one embodiment, the "width," i.e., a sidewall to sidewall distance, of each deep trench 45 can be from 30 nm to 150 nm, although lesser dimensions can be employed with availability of lithographic tools capable of printing smaller dimensions in the future.

Figure 2:
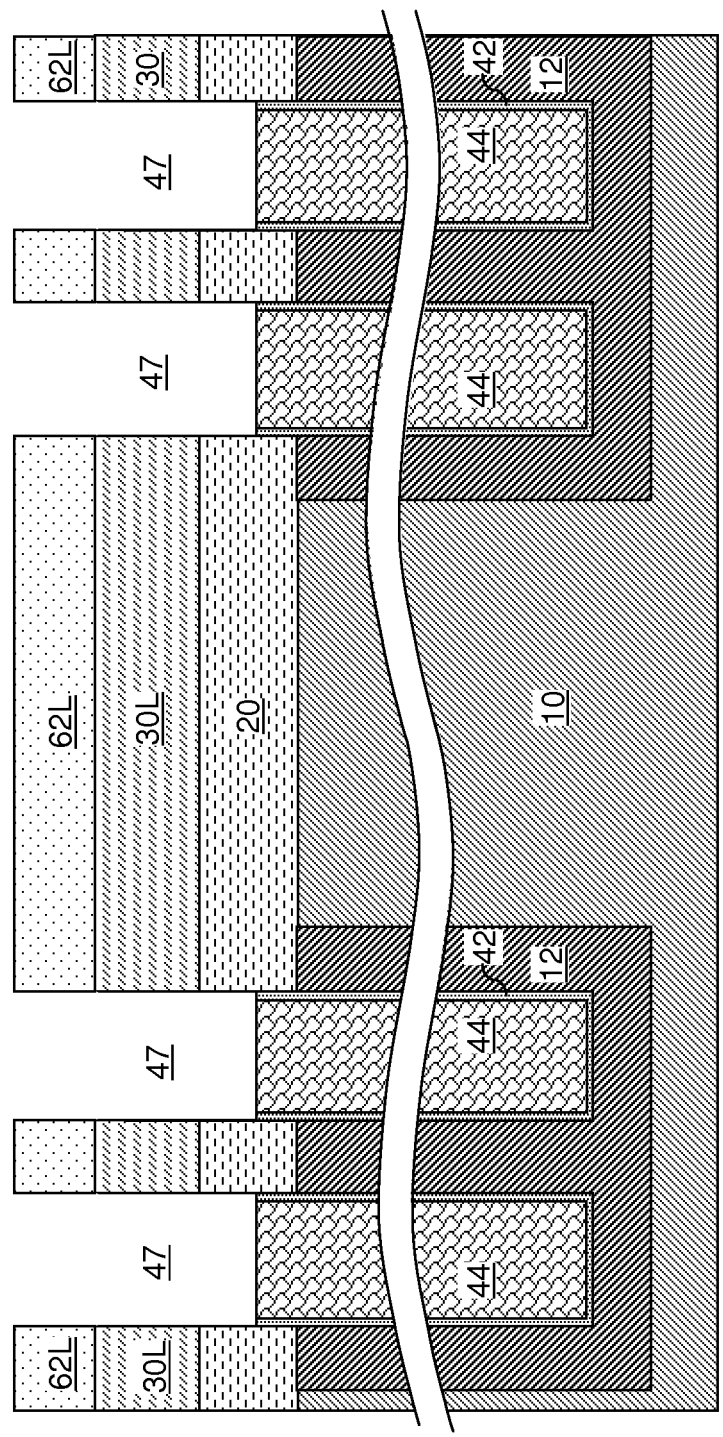
FIG. 2 is a vertical cross-sectional view of the exemplary semiconductor structure after formation of a node dielectric and an inner electrode in each deep trench according to an embodiment of the present disclosure.

Referring to FIG. 2, a buried plate 12 can be formed by doping a portion of the bottom semiconductor layer 12 in proximity to sidewalls of the bottom semiconductor layer 10 within each deep trench 45. Dopants can be introduced, for example, by outdiffusion from a dopant-including disposable material (such as a doped silicate glass) or by ion implantation as known in the art. Further, any other method of forming a buried plate 12 in the bottom semiconductor layer 10 of an SOI substrate (10, 20, 30L) can be employed in lieu of outdiffusion from a dopant-including disposable material or ion implantation. Alternately, the buried plate 12 can be provided as a contiguous layer constituting a top portion of the bottom semiconductor layer 10 within the SOI substrate (10, 20, 30L) as provided prior to the processing steps of FIG. 1. In one embodiment, the thickness of the buried plate 12 (i.e., the vertical distance between the top surface of the buried plate 12 and the bottom surface of the buried plate 12) can be in a range from 2 microns to 10 microns, although lesser and greater thicknesses can also be employed. In an illustrative example, the buried plate 12 can be composed of heavily doped single crystalline silicon or a heavily doped polycrystalline silicon-containing material.

In one embodiment, the buried plate 12 can be doped with dopants of a second conductivity type which is the opposite of the first conductivity type. For example, the first conductivity type can be p-type and the second conductivity type can be n-type, or vice versa. A p-n junction is formed between the remaining portion of the bottom semiconductor layer 10 and the buried plate 12. The dopant concentration in the buried plate 12 can be, for example, from $1.0 \times 10^{18}/cm^3$ to $2.0 \times 10^{21}/cm^3$, and typically from $5.0 \times 10^{18}/cm^3$ to $5.0 \times 10^{19}/cm^3$, although lesser and greater dopant concentrations can also be employed.

A node dielectric layer can be deposited conformally on all physically exposed sidewalls in the deep trenches and on the top surface of the at least one dielectric pad layer 62L. The node dielectric layer can include any dielectric material that can be employed as a node dielectric material in a capacitor known in the art. For example, the node dielectric layer can include at least one of silicon nitride and a dielectric metal oxide material such as high dielectric constant (high-k) gate dielectric material as known in the art.

An inner electrode layer can be deposited to completely fill the deep trenches 45. The inner electrode layer includes a conductive material, which can be a metallic material or a doped semiconductor material. The metallic material can be an elemental metal such as W, Ti, Ta, Cu, or Al, or an ally of at least two elemental metals, or a conductive metallic nitride of at least one metal, or a conductive metallic oxide of at least one metal. The doped semiconductor material can be a doped elemental semiconductor material, a doped compound semiconductor material, or an alloy thereof. The inner electrode layer can be deposited by physical vapor deposition (PVD), chemical vapor deposition (CVD), electroplating, electroless plating, or a combination thereof. The inner electrode layer is deposited to a thickness that is sufficient to completely fill the deep trenches 45.

The inner electrode layer can be vertically recessed to a level between the top surface of the buried insulator layer 20 and the bottom surface of the buried insulator layer 20 by a recess etch. The recess etch of the conductive material layer can employ an anisotropic etch such as a reactive ion etch, an isotropic etch such as a wet etch, or a combination thereof. The recess etch can be selective to the material of the node dielectric layer.

Each remaining portion of the inner electrode layer constitutes an inner electrode 44. Each inner electrode 44 includes the conductive material of the inner electrode layer, and is formed in a deep trench 45. The topmost surface of each inner electrode 44 can be substantially planar, and can be located between the level of the top surface of the buried insulator layer 20 and the level of the bottom surface of the buried insulator layer 20. As used herein, a surface is "substantially planar" if the planarity of the surface is limited by microscopic variations in surface height that accompanies semiconductor processing steps known in the art. A cavity 47 is formed above each inner electrode 44.

The physically exposed portions of the node dielectric layer can be patterned by an etch, which can be a wet etch. For example, if the node dielectric layer includes silicon nitride, the physically exposed portions of the node dielectric layer can be removed by a wet etch employing hot phosphoric acid. The remaining portion of the node dielectric layer within each deep trench 45 constitutes a node dielectric 42. Each set of a portion of the buried plate 12 laterally surrounding a deep trench, a node dielectric 42 on the sidewalls of the deep trench, and the inner electrode 44 therein constitute a trench capacitor (12, 42, 44). The buried plate 12, which can be a single contiguous structure, is an outer node of the trench capacitors, each node dielectric 42 is a dielectric separating an outer electrode from an inner electrode, and each inner electrode 44 is the inner electrode of a trench capacitor. Each trench capacitor is embedded within the SOI substrate (10, 12, 20, 30L). The buried insulator layer 20 overlies the buried plate 12 (i.e., the outer electrode).

Figure 3:
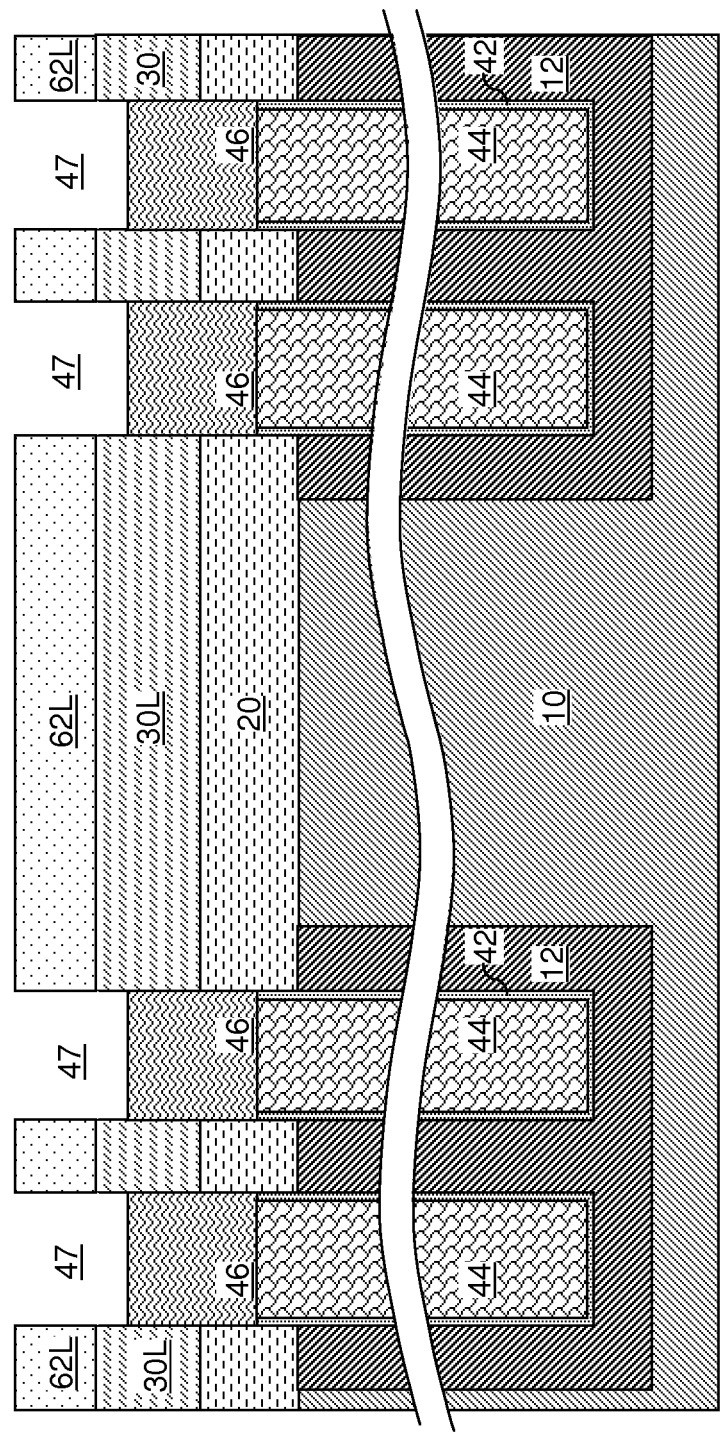
FIG. 3 is a vertical cross-sectional view of the exemplary semiconductor structure after formation of a conductive strap structure according to an embodiment of the present disclosure.

Referring to FIG. 3, a conductive strap structure 46 can be formed directly on a top surface of each inner electrode 46, for example, by depositing a conductive material within the cavity 47 and above the at least one dielectric pad layer 62L, and subsequently recessing the conductive material. Specifically, the conductive material can be a metallic material or a doped semiconductor material. The metallic material can be an elemental metal such as W, Ti, Ta, Cu, or Al, or an alloy of at least two elemental metals, or a conductive metallic nitride of at least one metal, or a conductive metallic oxide of at least one metal. The doped semiconductor material can be a doped elemental semiconductor material, a doped compound semiconductor material, or an alloy thereof. The conductive material can be deposited by physical vapor deposition (PVD), chemical vapor deposition (CVD), electroplating, electroless plating, or a combination thereof. The conductive material can be deposited to a thickness that is sufficient to completely fill each cavity 47 immediately after deposition.

The conductive material can be planarized, for example, by chemical mechanical planarization (CMP) employing the at least one dielectric pad layer 62L as a stopping layer. Subsequently, the conductive material is recessed to a depth between the top surface of the at least one dielectric pad layer 62L and the bottom surface of the top semiconductor layer 30L to form the conductive strap structures 46. In one embodiment, the top surface of each conductive strap structure 46 can be located at, or above, the top surface of the top semiconductor layer 30L. The conductive strap structure 46 can include the same material as, or a material different from, the inner electrode 44. A cavity 47 is formed above each conductive strap structure 46. Each conductive strap structure 46 is in contact with, and overlies, an inner electrode 44.

Figure 4:
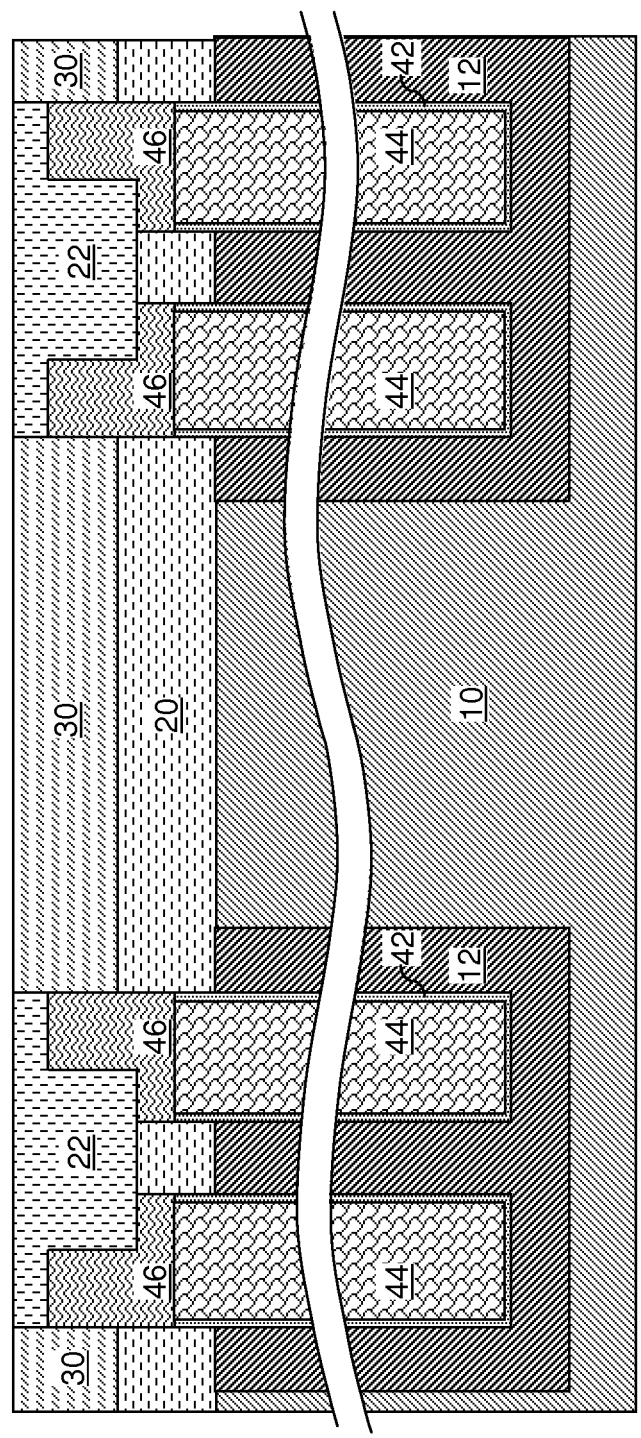
FIG. 4 is a vertical cross-sectional view of the exemplary semiconductor structure after formation of shallow trench isolation structures according to an embodiment of the present disclosure.

Referring to FIG. 4, a shallow trench isolation structure 22 can be formed by forming a contiguous shallow trench and filling the contiguous shallow trench with a dielectric material. The contiguous shallow trench can be formed, for example, by applying a photoresist layer (not shown) over the at least one dielectric pad layer 62L, by lithographically patterning the photoresist layer to cover the active regions of the top semiconductor layer 30L and adjacent portions of the conductive strap structures 46, and by anisotropically recessing physically exposed portions of the top semiconductor layer 30L and the conductive strap structures 46. The photoresist layer can be removed, for example, by ashing.

The contiguous shallow trench can be filled with a dielectric material such as silicon oxide and/or silicon nitride, for example, by chemical vapor deposition (CVD) or spin-coating. Excess portions of the deposited dielectric material is removed, for example, by chemical mechanical planarization (CMP) employing the at least one dielectric pad layer 62L as a stopping layer. The dielectric material filling the contiguous shallow trench can be recessed, for example, by a recess etch to a height that can be substantially coplanar with, raised above, or recessed below, the top surface of semiconductor material portions 30, which are remaining portions of the top semiconductor layer 30L. The remaining dielectric material in the contiguous shallow trench constitutes the shallow trench isolation structure 22. The at least one dielectric pad layer 62L can be removed, for example, by a wet etch process that is selective to the materials of the semiconductor material portions 30 and the conductive strap structures 46. In one embodiment, the wet etch can be selective to the dielectric material of the shallow trench isolation structure 22. In one embodiment, the initial recess depth for the dielectric material of the shallow trench isolation structure 22 during the recess etch can be controlled such that the top surface of the shallow trench isolation structure 22 after any collateral etching during the removal of the at least one dielectric pad layer 62L can be at a target height, which can be substantially coplanar with, raised above, or recessed below, the top surfaces of the semiconductor material portions 30.

Each semiconductor material portion 30 is a contiguous remaining portion of the top semiconductor layer 30L, and include a regions for forming at least one field effect transistor. In one embodiment, each semiconductor material portion 30 can include a region for forming a pair of access field effect transistors for accessing the inner electrodes 44 of a pair of trench capacitors (12, 42, 44).

Figure 5:
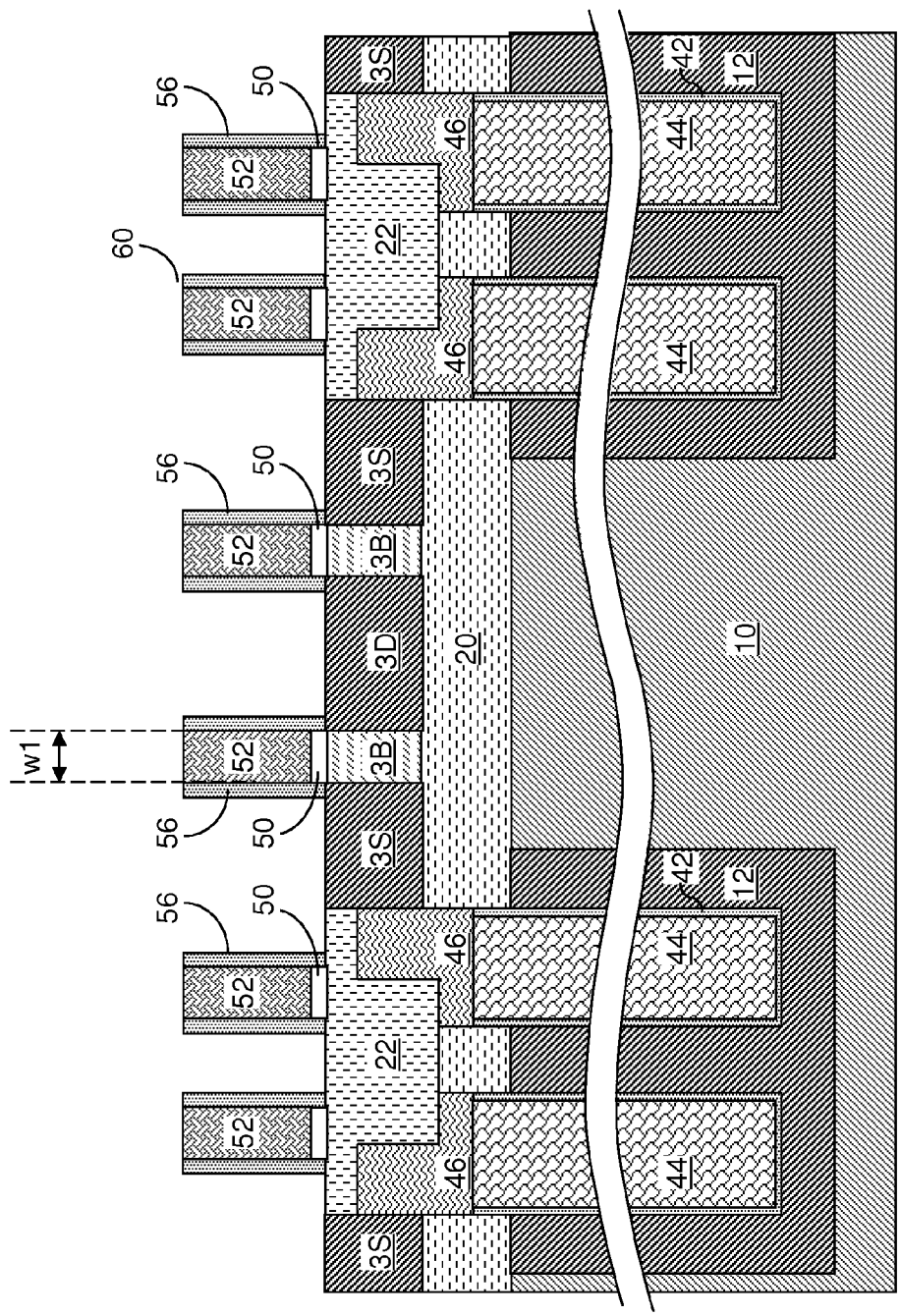
FIG. 5 is a vertical cross-sectional view of the exemplary semiconductor structure after formation of gate stack structures and source and drain regions according to an embodiment of the present disclosure.

Referring to FIG. 5, a pair of field effect transistors can be formed on each semiconductor material portion 30. Specifically, two gate stack structures (50, 52) are formed over, and across, each semiconductor material portion 30. Each gate dielectric 50 can include gate dielectric materials known in the art. Each gate electrode 52 can include a doped semiconductor material such as doped polysilicon or a doped silicon-containing semiconductor alloy material.

In an array environment, each gate stack structure (50 52) can be formed as a line structure that overlies a plurality of semiconductor material portions 30 and a plurality of deep trench capacitors (12, 42, 44). A gate spacer 56 can be formed around each gate stack structure (50, 52). A pair of source regions 3S and a drain region 3D can be formed by doping portions of each semiconductor material portion 30 employing the gate stack structures (50, 52) as an implantation mask. A remaining portion of each semiconductor material portion 30 underlying the gate stack structure (50, 52) constitutes a body region 3B. Thus, each semiconductor material portion (3S, 3D, 3B) can include a pair of source regions 3S, a drain region 3D, and a pair of body regions 3B.

Each field effect transistor can be an access transistor for a trench capacitor (12, 42, 44). As used herein, an "access transistor" refers to a transistor that controls the flow of electrical charges into a capacitor. The source region 3S of each access transistor contacts a conductive strap structure 46, and is electrically shorted to an inner electrode 44 of a trench capacitor (12, 42, 44). The gate electrode 52 of an access transistor can have a first width w1 between a pair of vertical parallel sidewalls that straddle a semiconductor material portion (3S, 3B, 3D).

Figure 6:
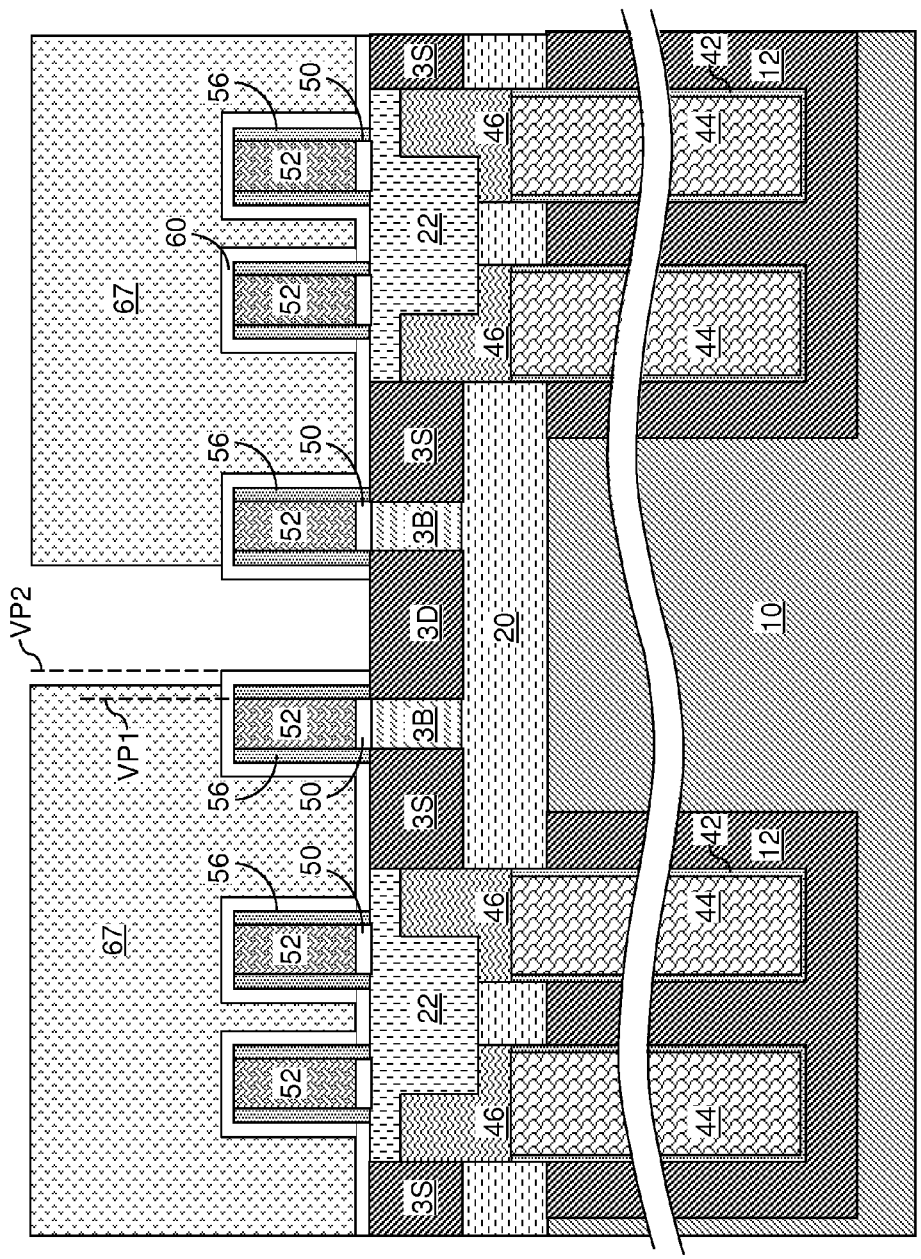
FIG. 6 is a vertical cross-sectional view of the exemplary semiconductor structure after deposition and patterning of a dielectric liner according to an embodiment of the present disclosure.

Referring to FIG. 6, a dielectric liner 60 can be deposited on the physically exposed surfaces of the gate electrodes 52, the gate spacers 56, the shallow trench isolation structure 22, the source regions 3S, and the drain regions 3D. The dielectric liner 60 includes a dielectric material such as silicon nitride, silicon oxide, a dielectric metal oxide, or a combination thereof. In one embodiment, the dielectric liner 60 can include silicon nitride. The dielectric liner 60 can be deposited by a conformal deposition method such as low pressure chemical vapor deposition (LPCVD), or can be deposited by a non-conformal deposition method such as plasma enhanced chemical vapor deposition (PECVD). The thickness of horizontal portions of the dielectric liner 60 can be in a range from 3 nm to 30 nm, although lesser and greater thicknesses can also be employed. At the time of deposition, the dielectric liner 60 is formed as a single contiguous structure that contacts all physically exposed top surfaces and sidewall surface of the exemplary semiconductor structure.

A photoresist layer 67 is applied over the dielectric liner 60, and is lithographically patterned to form an opening over each drain region 3D. The edges of the patterned photoresist layer 67 around each opening can be located between a first vertical plane VP1 including a sidewall of a neighboring gate electrode 52 and a second vertical plane VP2 including an outer sidewall of the dielectric liner 60 in proximity to the opening. In one embodiment, the edges of the patterned photoresist layer 67 around each opening can be located between another vertical plane including an inner sidewall of the dielectric liner 60 in proximity to the opening and the second vertical plane VP2. Horizontal portions of the dielectric liner 60 that are not masked by the photoresist layer 67 can be removed by an etch, which can be an anisotropic etch. A portion of the top surface of each drain region 3D can be physically exposed after the anisotropic etch. The lateral extent of the physically exposed portion of the drain region can extend between a pair of vertical sidewalls of the dielectric liner 60 along one direction, and by sidewalls of the shallow trench isolation structure 22 along another direction. The photoresist layer 67 may, or may not, be removed after the anisotropic etch. The removal of the photoresist layer 67 can be performed, for example, by ashing.

Figure 7:
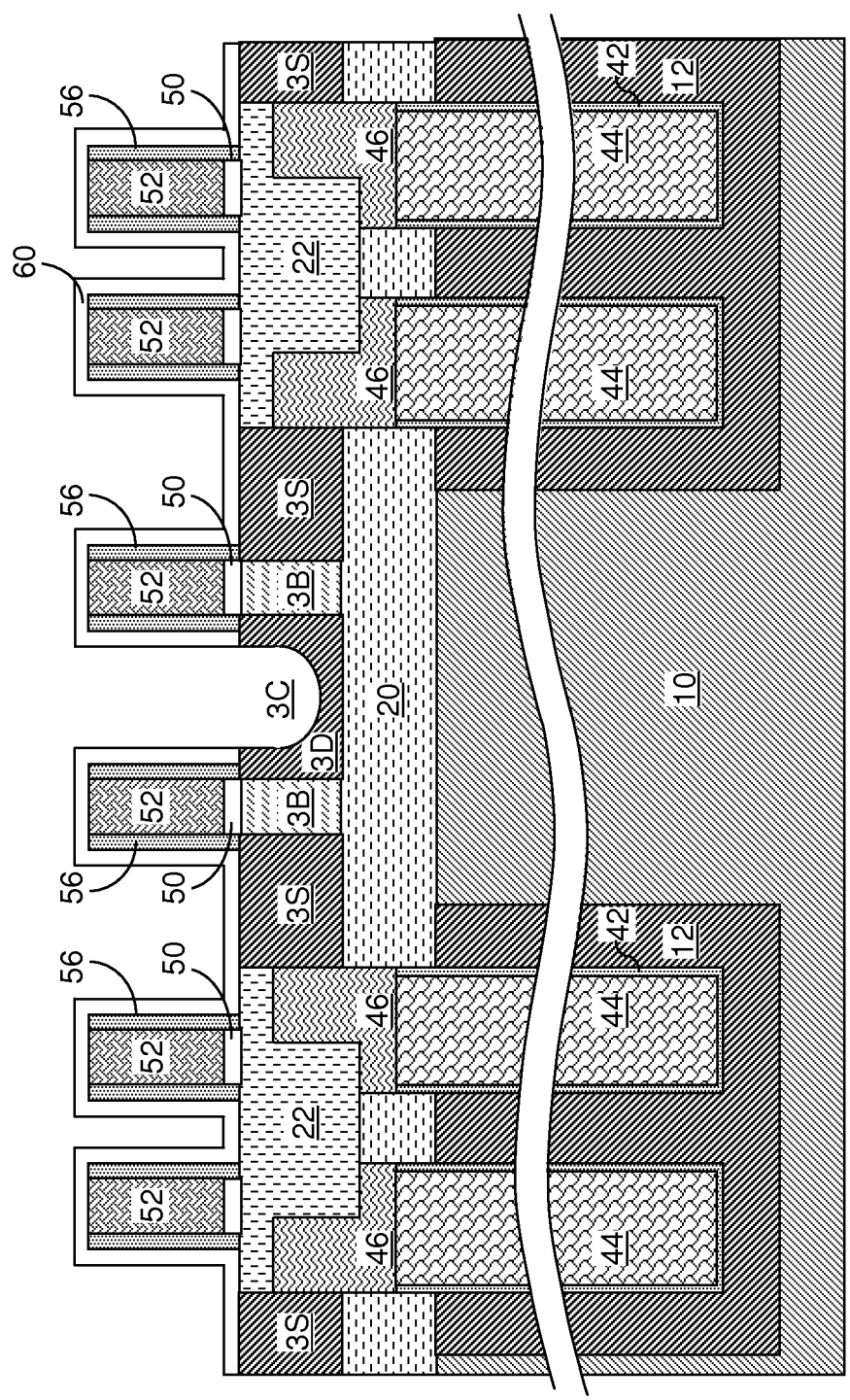
FIG. 7 is a vertical cross-sectional view of the exemplary semiconductor structure after formation of a cavity within a drain of access field effect transistors according to an embodiment of the present disclosure.

Referring to FIG. 7, each physically exposed portion of drain regions 3D is vertically recessed employing an anisotropic etch. The dielectric liner 60 alone, or the combination of the dielectric liner 60 and the photoresist layer 67 (if the photoresist layer 67 is still present) can be employed as an etch mask for the anisotropic etch that recesses the physically exposed portions of the drain regions 3D. A cavity 3C is formed within each drain region 3D. All surfaces of each cavity 3C are surfaces of the drain region 3D that embeds the cavity 3C. Because the dielectric liner 60 is employed as the etch mask during the anisotropic etch that forms the cavities 3C, sidewalls of each cavity 3C can be vertically coincident with sidewalls of the dielectric liner 60 during, and after, formation of the cavities 3C. In one embodiment, the dielectric liner 60 can cover the entirety of the top surface of each source region 3C while the cavities 3C are formed within the drain regions 3D. Any remaining portion of the photoresist layer 67 can be removed, for example, by ashing.

Figure 8:
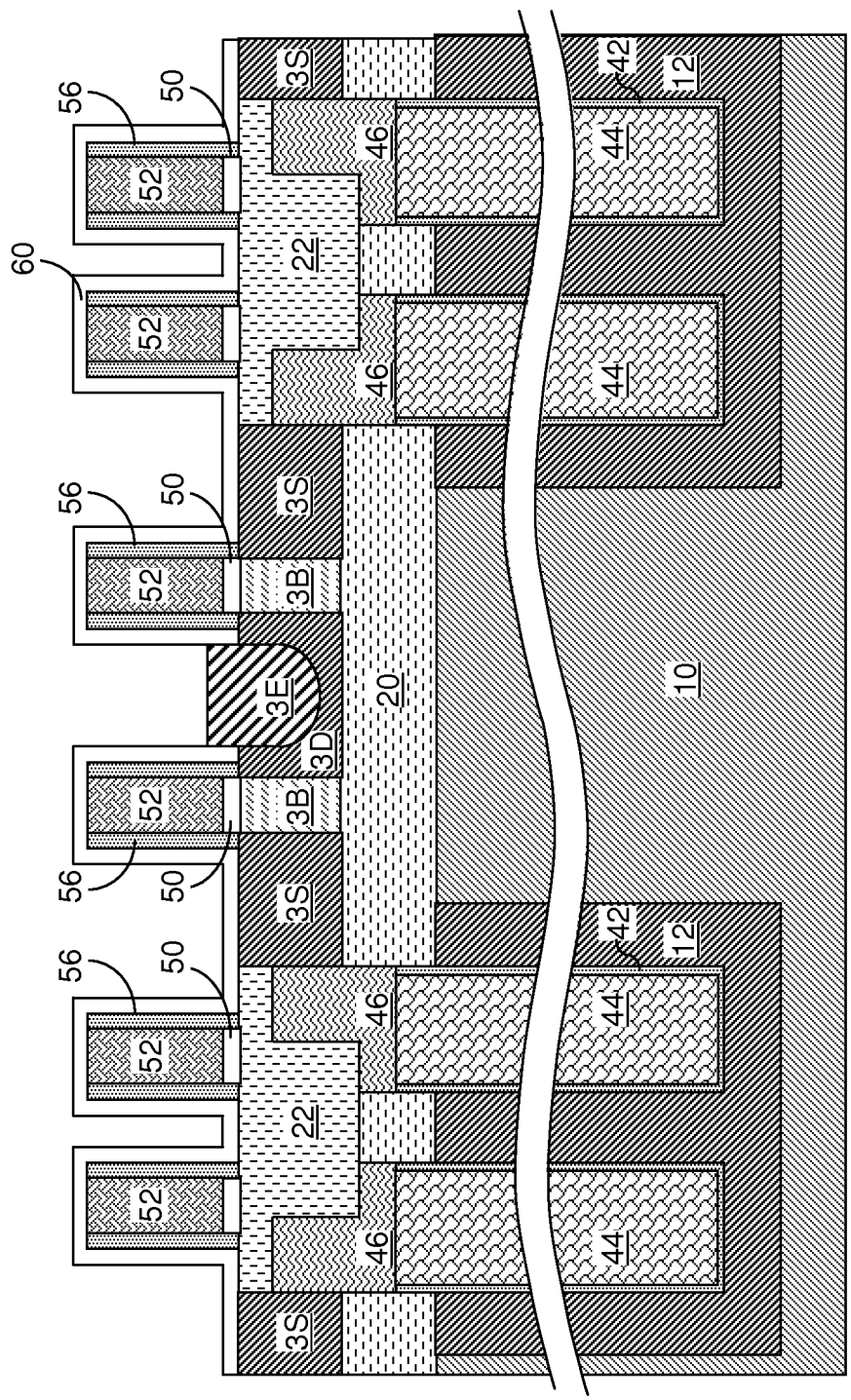
FIG. 8 is a vertical cross-sectional view of the exemplary semiconductor structure after formation of a stressor structure according to an embodiment of the present disclosure.

Referring to FIG. 8, a stressor structure 3E is formed within each cavity 3C by deposition of a second semiconductor material that is different from the first semiconductor material, i.e., the semiconductor material of the semiconductor material portions (3S, 3D, 3B). The second semiconductor material can be deposited by selective epitaxy, in which the second semiconductor material is deposited on semiconductor surfaces, and is not deposited on dielectric surfaces such as the surfaces of the dielectric liner 60. During the selective epitaxy process, one or more reactant gases including at least one precursor for the second semiconductor material and an etchant gas are simultaneously or alternately flowed into a process chamber including the exemplary semiconductor structure. The deposition rate of the second semiconductor material on the surfaces of the cavities 3C is greater than the etch rate of the second semiconductor material provided by the etchant gas, while the deposition rate of the second semiconductor material on the surfaces of the dielectric liner 60 is less than the etch rate of the second semiconductor material provided by the etchant gas.

In an illustrative example, the first semiconductor material can be silicon, the source regions 3S and the drain regions 3E can include n-doped silicon, the body regions 3B can include p-doped silicon, and the stressor structure 3E can include a silicon-carbon alloy. In this case, the at least one precursor for the silicon-carbon alloy can include a precursor for silicon and a precursor for carbon. The precursor for silicon can be selected from, for example, $SiH_4$, $Si_2H_6$, $SiH_2Cl_2$, $SiHCl_3$, $SiCl_4$, and other precursor gases for silicon. The precursor for carbon can be selected from, for example, $CH_4$, $C_2H_2$, $C_2H_4$, $C_2H_6$, and $C_3H_8$, and other known precursor gases for carbon. The etchant gas can be, for example, HCl. A carrier gas such as hydrogen gas can be employed during the epitaxy process. The temperature and the pressure for the selective epitaxy process can be selected from ranges known in the art.

Each stressor structure 3E is formed as a single crystalline semiconductor material region having a lattice constant different from the lattice constant of the drain regions 3D. Because the stressor structures 3E are formed within the drain regions 3D and not in the source regions 3S, the stressor structures 3E generate an asymmetric stress across each combination of a drain region 3D, a body region 3B, and a source region 3S of an access transistor. Specifically, the stress generated by the stressor structure 3E has the greatest magnitude within the drain regions 3D, has a lesser magnitude within the body regions 3B, and has the least magnitude within the source region 3S. Correspondingly, within each access transistor, the magnitude of the asymmetric stress is greater at a first interface between the drain region 3D and the body region 3B than at a second interface between the source region 3S and the body region 3B.

In the case of stressor structures 3E including a silicon-carbon alloy and semiconductor material portions (3S, 3B, 3D) that include single crystalline silicon material, the stressor structures 3E can apply a tensile stress on the source regions 3S, the body regions 3B, and the drain regions 3D of the access transistors such that the magnitude of the tensile stress decreases as the location of measurement of the stress moves away from the stressor structure 3E in each access transistor.

The stressor structures 3E can have the same type of doping as the drain regions 3D. For example, if the drain regions 3D have n-type doping, the stressor structures 3E can have n-type doping. If the drain regions 3D have p-type doping, the stressor structures 3E can have p-type doping. The stressor structure 3E can be doped with electrical dopants, which can be p-type dopants or n-type dopants, by in-situ doping during the selective epitaxy process by flowing a dopant gas concurrently with the one or more reactant gases, and/or can be formed by ex-situ doping by implanting electrical dopants into the stressor structure 3E, for example, by ion implantation.

Figure 9:
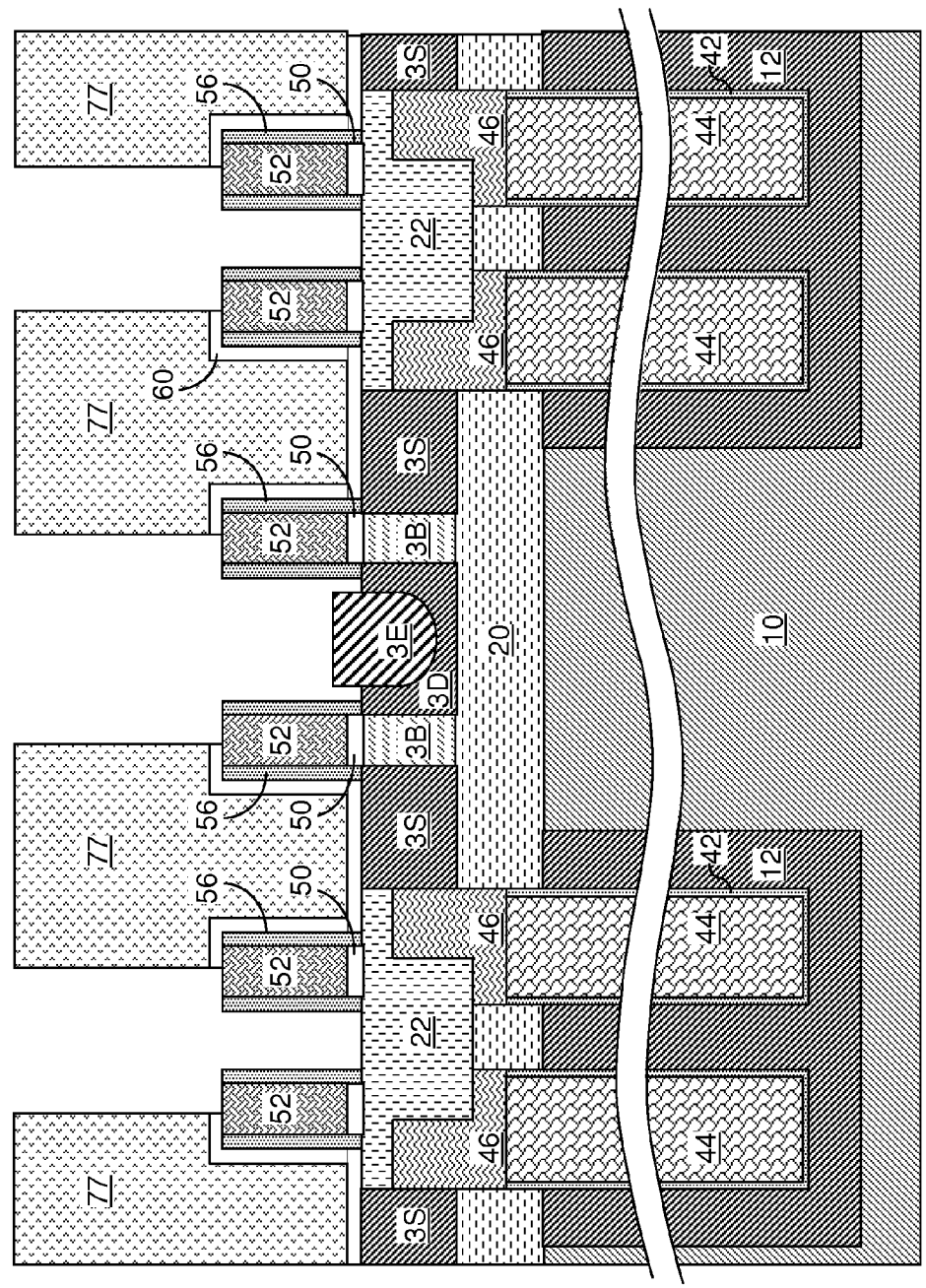
FIG. 9 is a vertical cross-sectional view of the exemplary semiconductor structure after additional patterning of the dielectric liner according to an embodiment of the present disclosure.

Referring to FIG. 9, a photoresist layer 77 can be applied over the dielectric liner 60, and can be lithographically patterned to form openings therein. Each opening in the photoresist layer 77 can extend along the lengthwise direction of the gate electrodes 52. The photoresist layer 77 is patterned such that the sidewalls of the photoresist layer are located between the pairs of sidewalls that define the widths of the gate electrodes 52. The patterned photoresist layer 77 covers all areas of the source regions 3S, adjoining portions of the gate spacers 56, and adjoining portions of the gate electrodes 52. All areas of the stressor structures 3E and neighboring top surfaces of the drain regions 3D become physically exposed between various portions of the patterned photoresist layer 77. An etch is performed to remove physically exposed portions of the dielectric liner 60. The etch can be an anisotropic etch or an isotropic etch. The etch can be selective to the semiconductor materials of the drain regions 3D and the stressor structures 3E. The duration of the etch can be selected such that collateral etching of the gate spacers 56 can be minimized. The photoresist layer 77 can be subsequently removed, for example, by ashing.

Portions of the top surfaces of the gate electrodes 52 are physically exposed after the etch. A bottom edge of a sidewall of a dielectric liner 60 can run parallel to the sidewalls of an underlying gate electrode 52, and can be laterally spaced from each of the top edges of the sidewalls of the underlying gate electrode 52. The percentage of the physically exposed portions of the top surface of each gate electrode 52 with respect to the total area of the top surface of the same gate electrode 52 can be in a range from 20% to 80%, although lesser and greater percentages can also be employed.

Figure 10:
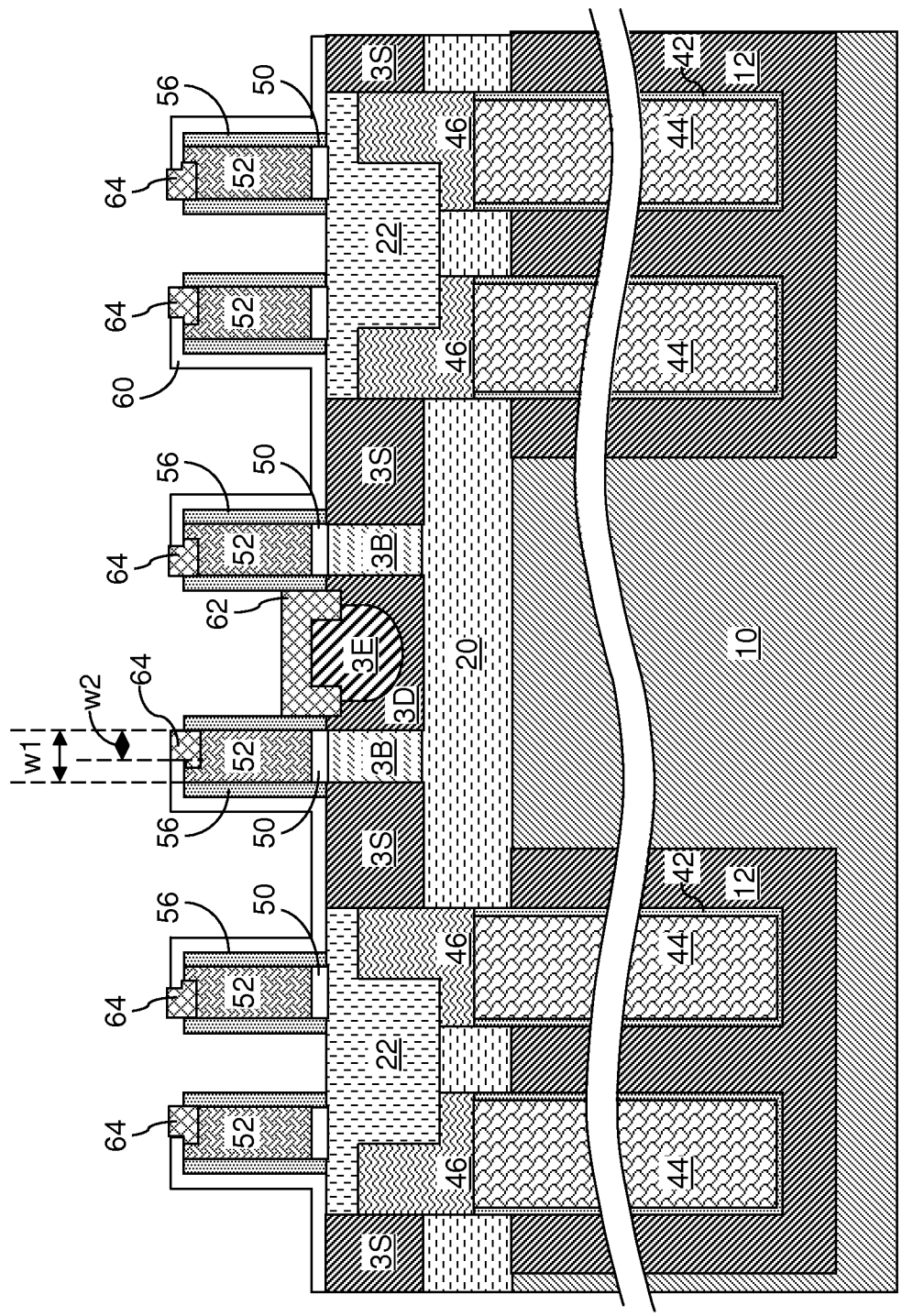
FIG. 10 is a vertical cross-sectional view of the exemplary semiconductor structure after formation of metal semiconductor alloy regions according to an embodiment of the present disclosure.

Referring to FIG. 10, a metal semiconductor alloy region (62, 64) can be formed on each physically exposed semiconductor surface of the exemplary semiconductor structure. The metal semiconductor alloy regions (62, 64) include drain metal semiconductor alloy regions 62 and gate metal semiconductor alloy regions 64. The metal semiconductor alloy regions (62, 64) can be formed by inducing a reaction of a metal with physically exposed portions of the semiconductor materials of the exemplary semiconductor structure. For example, a metal layer (not shown) can be deposited on the physically exposed surfaces of the stressor structures 3E, drain regions 3D, the gate electrodes 52, the dielectric liner 60, and the gate spacers 56. The metal layer includes an elemental metal or an alloy of elemental metals. For example, the metal layer can include Ni, Pt, Co, W, Ti, or a combination thereof. An anneal is performed at a temperature that induces formation of metal semiconductor alloy materials by reaction of the deposited metal and physically exposed portions of the semiconductor materials. Unreacted portions of the deposited metal, which are present on surfaces of the dielectric liner 60 and the gate spacers 56, are removed, for example, by a wet etch that removes unreacted metal selective to the metal semiconductor alloy materials.

A center portion of each drain metal semiconductor alloy region 62 includes a metal semiconductor alloy of the second semiconductor material of the stressor structure 3E and the metal provided through the metal layer. Further, peripheral portions of each drain metal semiconductor alloy region 62 include another metal semiconductor alloy of the first semiconductor material of the drain region 3D and the metal provided through the metal layer. Each drain metal semiconductor alloy region 62 can contact an underlying stressor structure 3E, an underlying drain region 3D, and sidewalls of two gate spacers 56. Each gate metal semiconductor alloy region 64 formed on a gate electrode 52 includes an alloy of the semiconductor material of the gate electrodes 52 and the metal from the metal layer.

A gate electrode 52 straddling a semiconductor material region (3S, 3B, 3D) can have a first width w1 between a pair of sidewalls of the gate electrode 52. A gate metal semiconductor alloy region 64 on the gate electrode 52 can contact a sidewall of a dielectric liner 64 and an inner sidewall of a gate spacer 56. The distance of between the vertical surface of the gate metal semiconductor alloy region 64 in contact with the sidewall of the dielectric liner 64 and the vertical surface of the gate metal semiconductor alloy region 64 in contact with the sidewall of the gate spacer 56 is herein referred to as a second width w2, which is less than the first width w1. The second width w2 is defined between a pair of vertical sidewalls of the gate metal semiconductor alloy region 64. In one embodiment, the maximum lateral dimension of the gate metal semiconductor alloy region 64 along the direction perpendicular to the lengthwise direction of the gate electrode 52 can be less than the first width w1, which is the width of the gate electrode 52. The direction of the stress applied to the underlying body region 3B is along the direction perpendicular to the lengthwise direction of the gate electrode 52.

Figure 11:
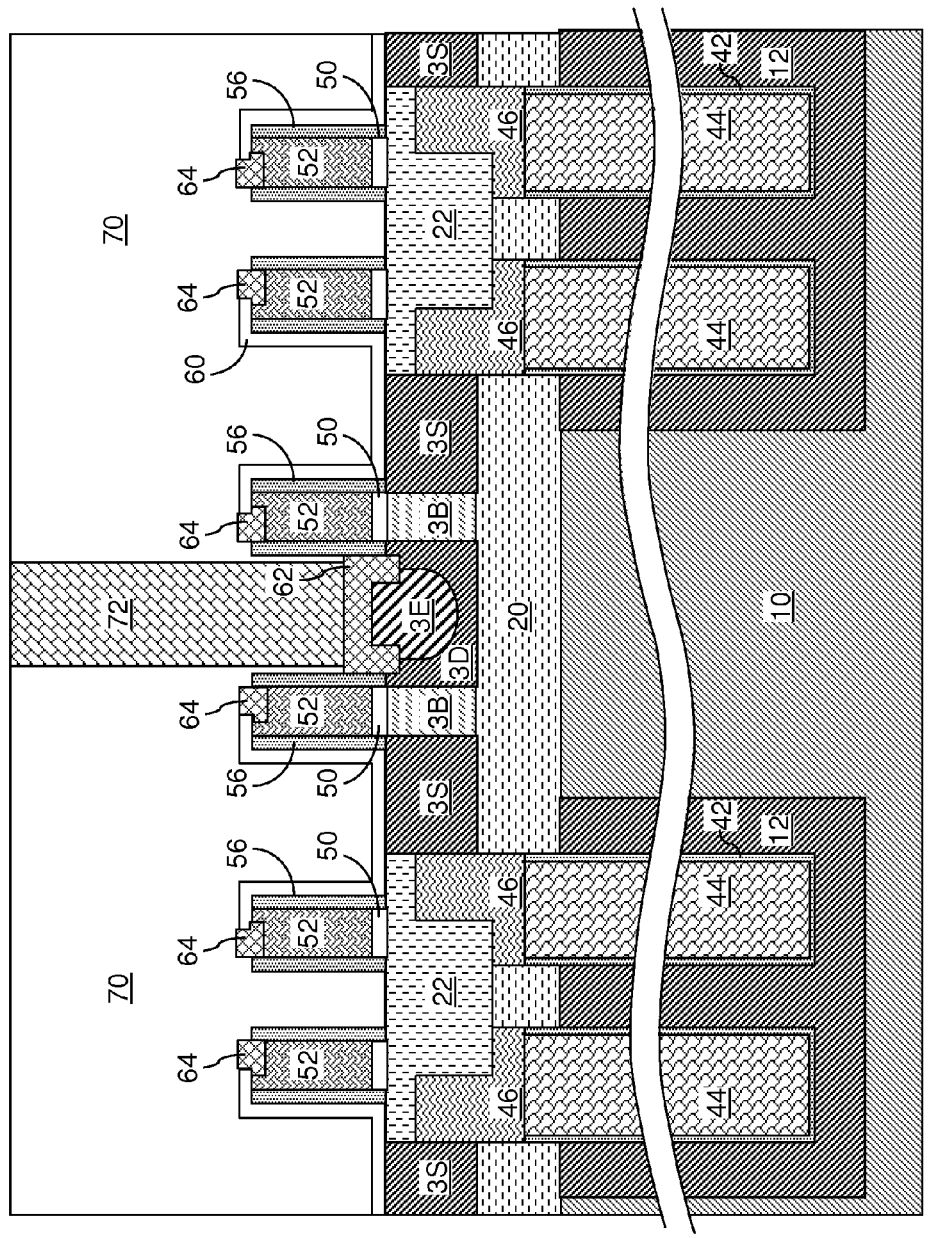
FIG. 11 is a vertical cross-sectional view of the exemplary semiconductor structure after formation of a contact level dielectric layer and contact via structures according to an embodiment of the present disclosure.

Referring to FIG. 11, a contact level dielectric layer 70 can be formed over the gate electrodes 52 and the various metal semiconductor alloy regions (62, 64), and can be planarized. The contact level dielectric layer 70 includes a dielectric material such as silicon oxide, silicon nitride, silicon oxynitride, porous or non-porous organosilicate glass (OSG), or a combination thereof. Drain contact via structures 72 can be formed through the contact level dielectric layer 70 by forming via cavities overlying the stressor structures 3E, and by filling the via cavities with a conductive material. Gate contact via structures (not shown) can be formed through the contact level dielectric layer to provide electrical contact to the gate electrodes 52.

The exemplary semiconductor structure includes at least a trench capacitor (12, 42, 44) embedded within a semiconductor substrate, which can be an SOI substrate (10, 20, 3S, 3B, 3D, 22). The exemplary semiconductor structure further includes an access field effect transistor including a source region 3S and a drain region 3D. The source region 3S is electrically shorted to an inner electrode 44 of the trench capacitor (12, 42, 44). The exemplary semiconductor structure further includes a stressor structure 3E embedded within the drain region 3D. The stressor structure 3E generates asymmetric stress across a body region 3B of the access field effect transistor. The stressor structure 3E can generate a uniaxial stress along a direction of current flow within the body region 3B, which is the direction perpendicular to the lengthwise direction of the gate electrode 52. As used herein, a "lengthwise direction" refers to a direction along which a element extends the farthest. The magnitude of the asymmetric stress can be greater at a first interface between the drain region 3D and the body region 3B than at a second interface between the source region 3S and the body region 3B.

The source region 3S and the drain region 3D can include a first semiconductor material, and the stressor structure 3E can include a second semiconductor material having a different lattice constant than the first semiconductor material. The exemplary semiconductor structure can include a drain metal semiconductor alloy region 3D including a metal semiconductor alloy of a metal and a semiconductor material of the stressor structure 3E, which is the second semiconductor structure. The drain metal semiconductor alloy region 3D can further include another metal semiconductor alloy of the metal and another semiconductor material of the drain region, i.e., the first semiconductor material that is different from the second semiconductor material of the stressor structure 3E.

In one embodiment, the exemplary semiconductor structure can further include a gate spacer 56 laterally surrounding a gate electrode 52 of the access field effect transistor. A sidewall of the stressor structure 3E can be laterally offset from a sidewall of the gate spacer 56. The offset distance can be the same as the lateral thickness of a dielectric liner 60, which is not present over the drain region 3D, but is present over the source region 3S. The dielectric liner 60 can contact an entire top surface of the source region 3S. The dielectric liner 60 does not have any surface that contacts the top surface of the drain metal semiconductor alloy regions 62 or the gate metal semiconductor alloy regions 64.

In one embodiment, a gate spacer 56 laterally surrounds a gate electrode 52 of the access field effect transistor. The dielectric liner 60 contacts a portion of the gate spacer 56 located on a source side, and does not contact a portion of the gate spacer 56 located on a drain side. The dielectric liner 60 does not contact the drain metal semiconductor alloy regions 62. The access field effect transistor includes a gate stack structure containing a gate electrode 52 having a first width w1 (See FIG. 10) between a pair of vertical parallel sidewalls, and a gate metal semiconductor alloy region 64 having a second width w2 (See FIG. 10) that is lesser than the first width w1.

Figure 12:
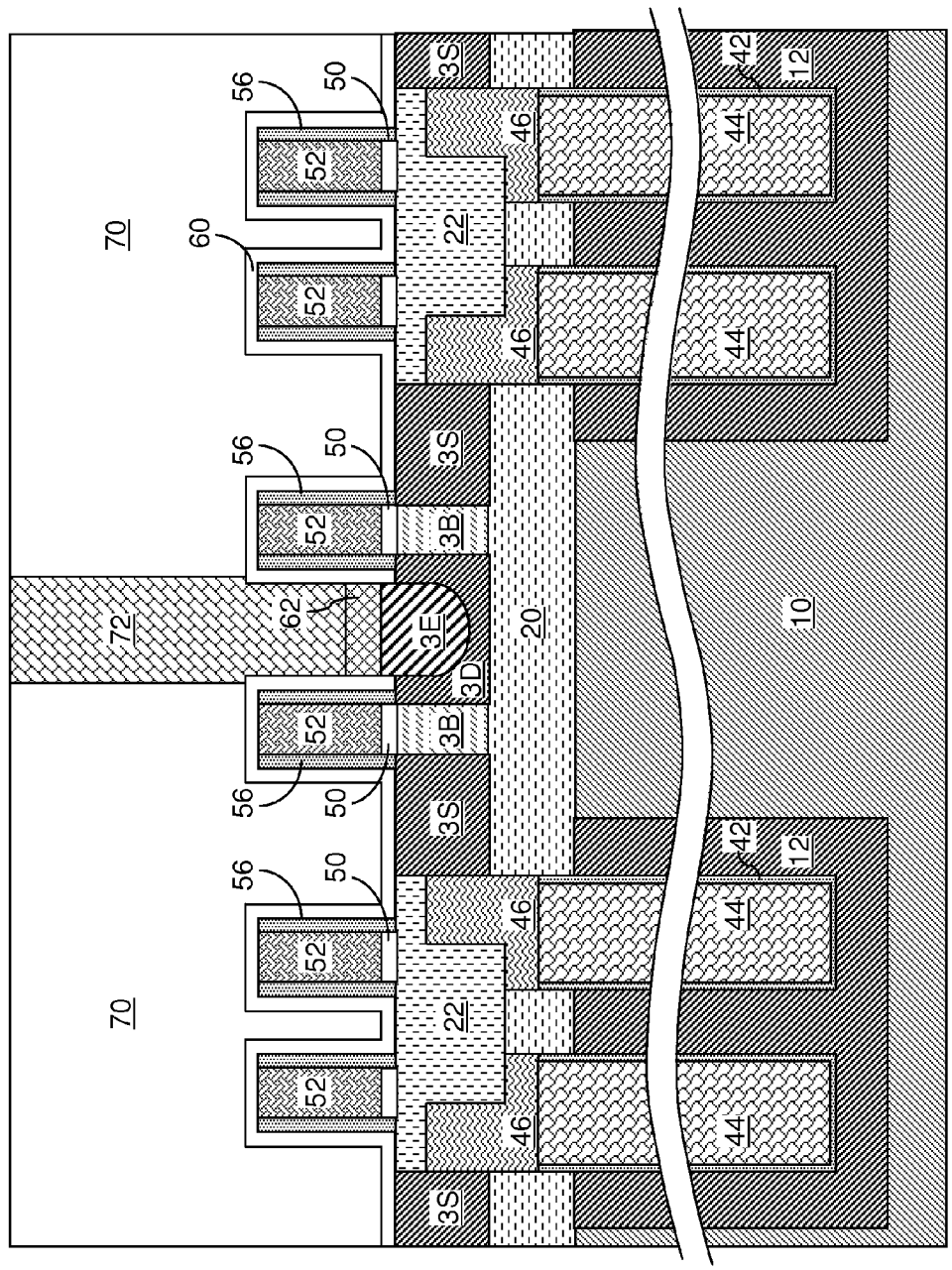
FIG. 12 is a vertical cross-sectional view of a first variation of the exemplary semiconductor structure according to an embodiment of the present disclosure.

Referring to FIG. 12, a first variation of the exemplary semiconductor structure according to an embodiment of the present disclosure can be derived from the exemplary semiconductor structure of FIG. 8 by omitting the processing steps of FIG. 9, and by performing the processing steps of FIGS. 10 and 11. In this case, the dielectric liner 60 contacts sidewalls of the drain metal semiconductor alloy regions 62. The sidewalls of each stressor structure 3E can be vertically coincident with sidewalls of the overlying drain metal semiconductor alloy region 62.

Figure 13:
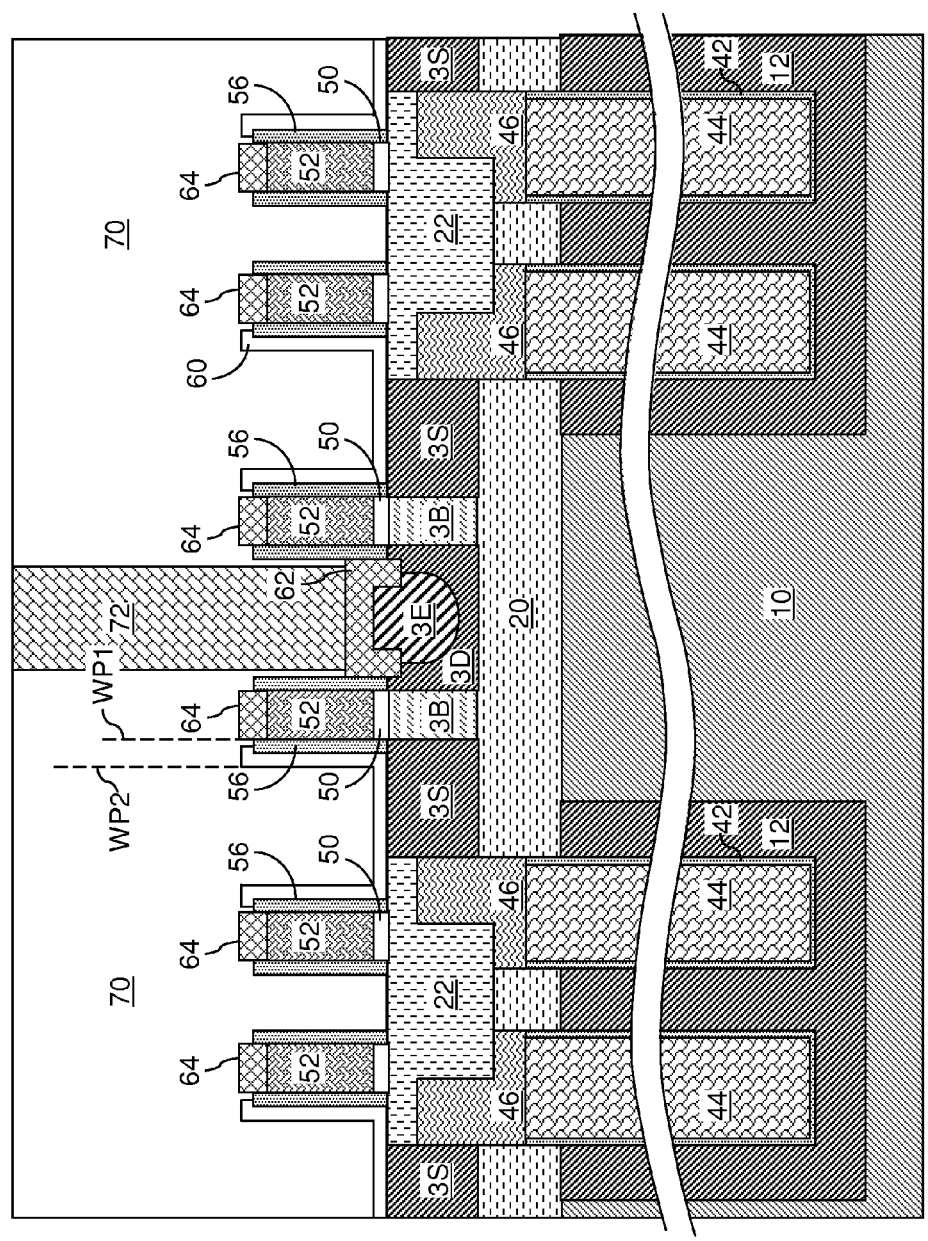
FIG. 13 is a vertical cross-sectional view of a second variation of the exemplary semiconductor structure according to an embodiment of the present disclosure.

Referring to FIG. 13, a second variation of the exemplary semiconductor structure according to an embodiment of the present disclosure can be derived from the exemplary semiconductor structure of FIG. 8 by performing the processing steps of FIG. 9 with the modification that the sidewalls of the patterned photoresist layer 77 are formed between a vertical plane W1 including a sidewall of a gate electrode 52 that is proximal to a source region 3S and another vertical plane W2 including an outer sidewall of the dielectric liner 60 that overlies the source region 3S. Subsequently, the processing steps of FIGS. 10 and 11 are performed. In this case, each gate metal semiconductor alloy portion 64 can laterally extend from one sidewall of the gate electrode 52 to another sidewall of the gate electrode 52, and thus, can have the first width w1. (See FIG. 10.) The entire top surface of each gate electrode 52 can be in contact with a bottom surface of a gate metal semiconductor alloy region 64.

Figure 14:
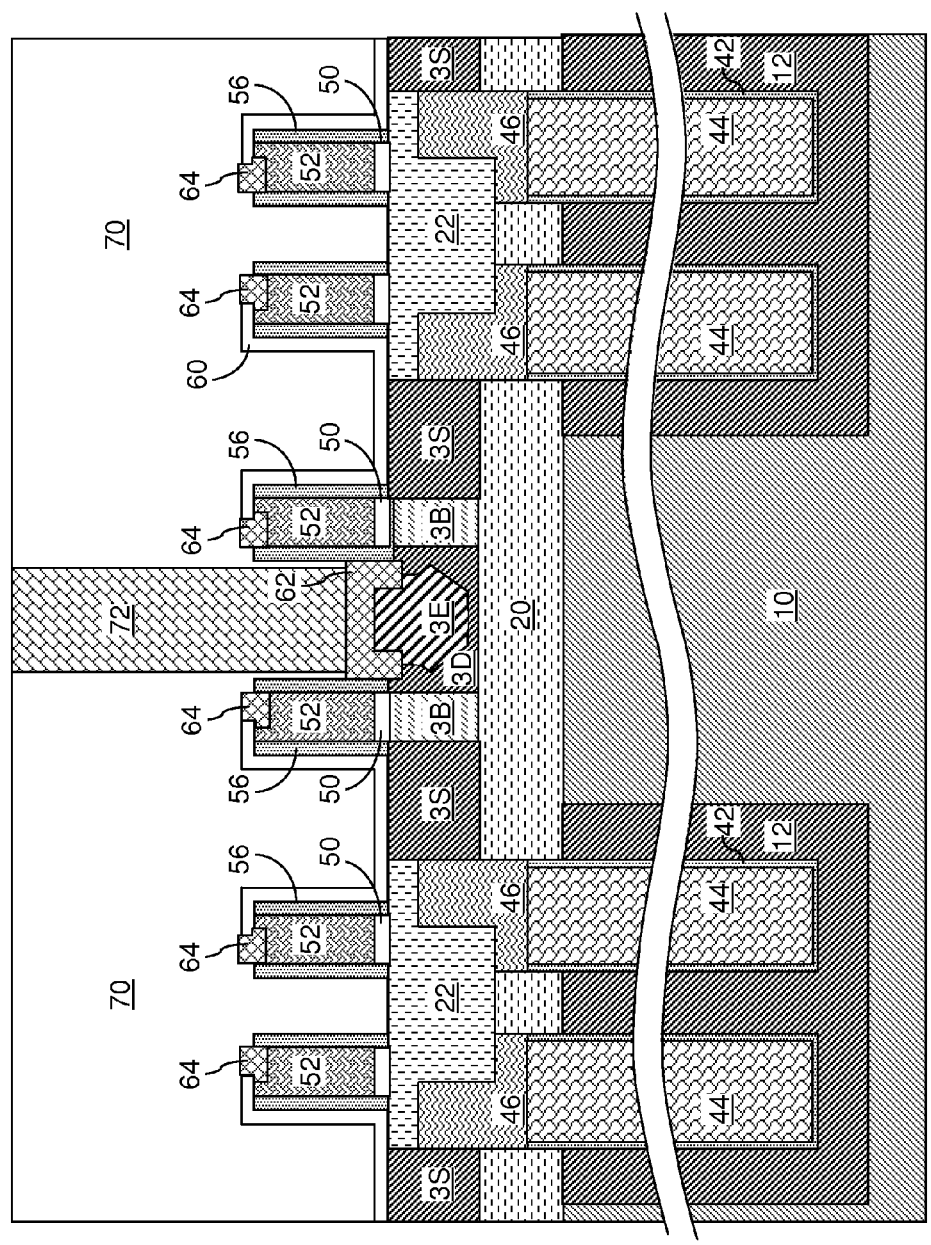
FIG. 14 is a vertical cross-sectional view of a third variation of the exemplary semiconductor structure according to an embodiment of the present disclosure.

Referring to FIG. 14, a third variation of the exemplary semiconductor structure according to an embodiment of the present disclosure can be derived from the exemplary semiconductor structure or any previous variations therefrom by performing an additional etch process after the processing steps of FIG. 7 and before the processing steps of FIG. 8 to alter the shape of the cavities 3C. For example, a crystallographic etch process or an isotropic etch process can be employed to widen, deepen, and/or shape the cavities 3C. Subsequently, the processing steps of FIGS. 8, 9, 10, and 11 can be performed. In this case, the stressor structures 3E can be formed in a shape that can optimize the unilateral stress applied to the body regions 3B of the access transistors.

The asymmetric stress applied to the body region 3B of each access transistor has the benefit of providing an increased leakage current only between the body region 3B and the drain region 3D, while not increasing leakage current between the body region 3B and the source region 3S. Thus, the source leakage current can remain at an insignificant level, while the increased drain leakage current rapidly increases the voltage of the body region 3B toward the voltage of the drain region 3D immediately prior to turning on the gate electrode 52 of the access transistor. The effect of changing the voltage of the body region 3B toward the voltage at the drain region 3D (which is a "high" voltage that can cause an on-current to flow as soon as the gate electrode 52 is turned on) has the effect of lowering the threshold voltage of the access transistor, and speeding up the turn-on operation of the access transistor and increasing the on-current of the access transistor once the access transistor is turned on.

Figure 15:
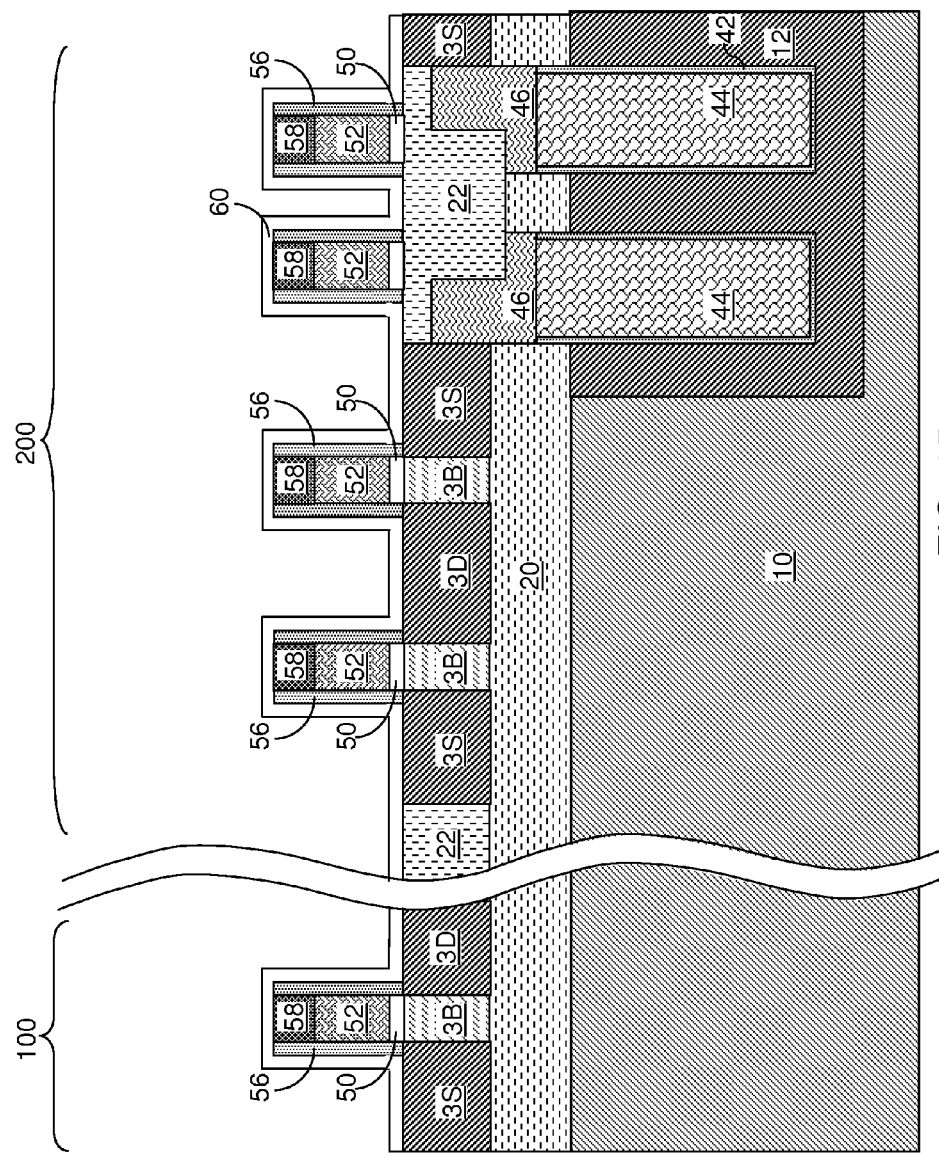
FIG. 15 is a vertical cross-sectional view of a fourth variation of the exemplary semiconductor structure after formation of gate stack structures, source and drain regions, and a dielectric liner according to an embodiment of the present disclosure.

Referring to FIG. 15, a fourth variation of the exemplary semiconductor structure according to an embodiment of the present disclosure can be derived from the exemplary semiconductor structure of FIG. 4 by modifying the composition of gate stack structures to be subsequently formed. Specifically, each gate stack structure (50, 52, 58) can include a gate dielectric 50, a gate electrode 52 including a doped semiconductor material, and a gate dielectric cap 58 that includes a dielectric material such as silicon nitride or silicon oxide. The thickness of each gate cap dielectric 58 can be in a range from 10 nm to 80 nm, although lesser and greater thicknesses can also be employed.

It is noted that the various semiconductor structures of the present disclosure can include a first device region 100 and an second device region 200. In the first device region, logic circuitry can be formed by field effect transistors interconnected in the manner known in the art. The second device region 200 can include dynamic random access memory (DRAM) devices in an array environment. In the second device region 200, each gate stack structure (50, 52, 58) can be formed as a line structure that overlies a plurality of semiconductor material portions 30 and a plurality of deep trench capacitors (12, 42, 44).

A gate spacer 56 can be formed around each gate stack structure (50, 52, 58). A pair of source regions 3S and a drain region 3D can be formed by doping portions of each semiconductor material portion 30 employing the gate stack structures (50, 52, 58) and/or the gate spacers 56 as an implantation mask. A remaining portion of each semiconductor material portion 30 underlying the gate stack structure (50, 52, 58) constitutes a body region 3B. Thus, each semiconductor material portion (3S, 3D, 3B) can include a pair of source regions 3S, a drain region 3D, and a pair of body regions 3B. In the second device region 200, each field effect transistor can be an access transistor for a trench capacitor (12, 42, 44). The source region 3S of each access transistor is electrically shorted to an inner electrode 44 of the capacitor (12, 42, 44). Each gate stack structure (50, 52, 58) includes a vertical stack, from bottom to top, of a gate dielectric 50, a gate electrode 52 that is a semiconductor material portion, and a gate dielectric cap 58. The dielectric liner 60 can be formed over the gate stack structures (50, 52, 58), the source regions 3S, and the drain regions 3D of the various field effect transistors. In one embodiment, the dielectric layer 60 can be deposited conformally so that all physically exposed surfaces of the gate stack structure (50, 52, 58), gate spacers 56, and the source and drain regions (3S, 3D) prior to formation of the dielectric layer 60 contact the dielectric layer 60 upon formation of the dielectric layer 60.

Figure 16:
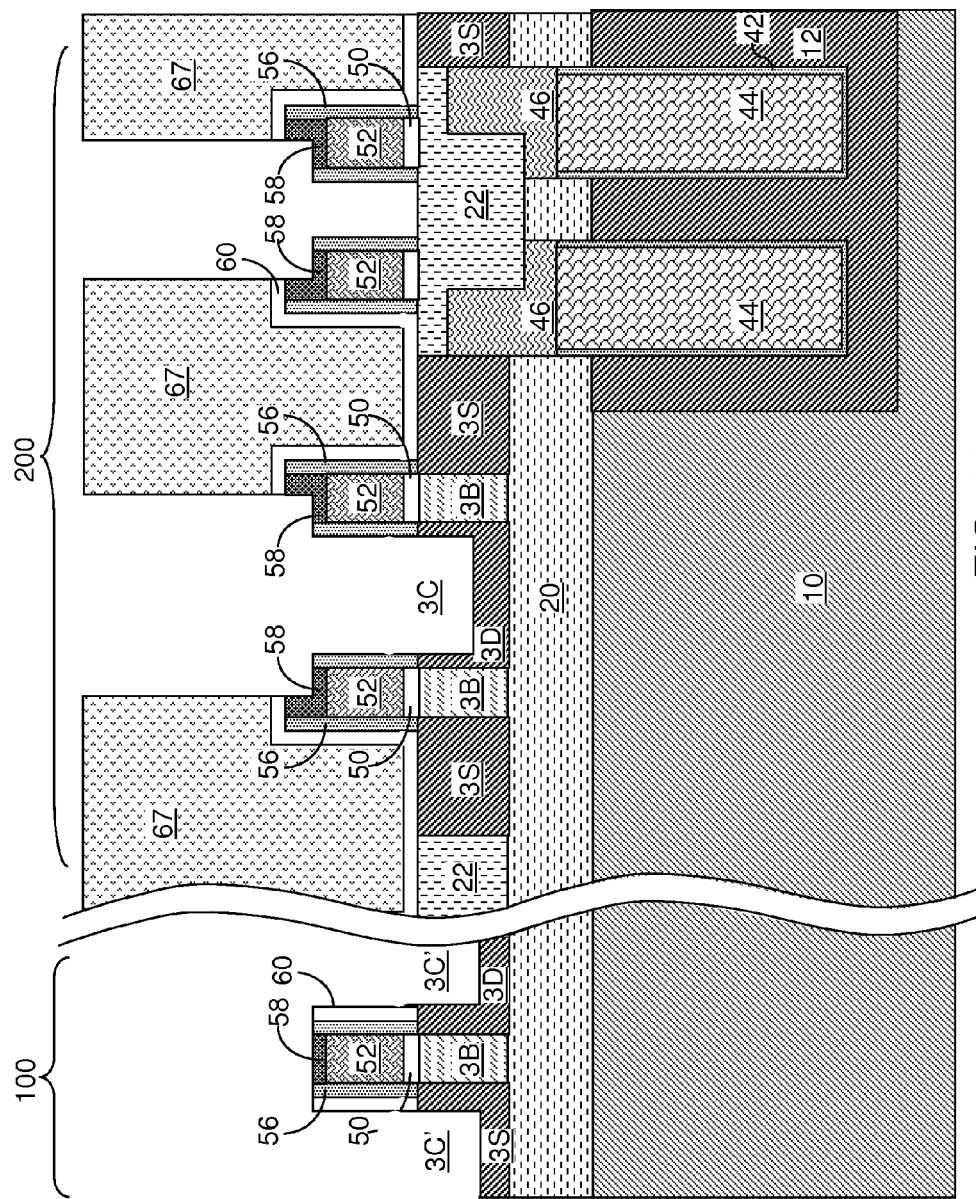
FIG. 16 is a vertical cross-sectional view of the fourth variation of the exemplary semiconductor structure after application and patterning of a photoresist layer, and removal of physically exposed portions of the dielectric liner according to an embodiment of the present disclosure.

Referring to FIG. 16, a photoresist layer 67 is applied and lithographically patterned. In one embodiment, the photoresist layer 67 can be patterned such that the photoresist layer 67 is removed from the first device region 100, and covers selected areas of the second device region 200. In one embodiment, the photoresist layer 67 can cover all areas of the source regions 3S in the second device region 200, while not covering areas of the drain regions 3D in the second device region 200. In one embodiment, sidewalls of the photoresist layer 67 can overlie top surfaces of the gate dielectric caps 58 the shallow trench isolation structures 22, and does not overlie any area of the source regions 3S.

An etch process can be performed to remove physically exposed portions of the dielectric liner 60. The etch process can be an isotropic etch process, an anisotropic etch process, an etch process with an isotropic etch component and an anisotropic etch component, or a combination of an isotropic etch and an anisotropic etch. Thus, within the second device region 200, portions of the dielectric liner 60 are removed from above the drain regions 60 and from above first portions of the gate dielectric caps 58 that do not underlie (i.e., not covered by) the photoresist layer 67 as patterned, while portions of the dielectric liner 60 that underlie the photoresist layer 67 and located above second portions of the gate dielectric caps 58 are not removed by the etch process.

Subsequently, physically exposed portions of the source region(s) 3S in the first device region 100 and physically exposed portions of the drain regions 3D in the first and second device regions (100, 200) are recessed by another etch process, which can include an anisotropic etch, an isotropic etch, or a combination thereof. If an anisotropic etch is employed, the anisotropic etch can be a reactive ion etch or a crystallographic etch.

A cavity 3C is formed in each space from which an upper portion of a drain region 3D in the second device region 200 is removed. Additional cavities 3C' can be formed in each space from which an upper portion of a source region 3S or a drain region 3D is removed in the first device region 100. In one embodiment, the physically exposed portions of the source region(s) 3S in the first device region 100 and physically exposed portions of the drain regions 3D in the first and second device regions (100, 200) can be vertically recessed by a reactive ion etch such that the sidewalls of the cavity 3C in the second device region 200 are vertically coincident with outer sidewalls of the gate spacers 56, and the sidewalls of cavities 3C' in the first device region 100 are vertically coincident with outer sidewalls of the dielectric liner 60 in the first device region 100.

The recessing of the source and drain regions (3S, 3D) for the purpose of forming the cavities (3C, 3C') induces collateral etching of gate dielectric caps 58 in areas that are not covered by the photoresist layer 67. Thus, a cavity 3C in the drain region 3D and first portions of the gate dielectric caps that are proximal to the drain region are concurrently recessed in the second device region 200, while second portions of the gate dielectric caps that are distal from the drain region 3D and underlying the photoresist layer 67 are not recessed during the recessing of the source and drain regions (3S, 3D). In one embodiment, the dielectric liner 60 covers the entirety of the top surface of the source regions in the second device region 200, while the cavities (3C, 3C') are formed within the source regions 3S and the drain regions. Each gate spacer 56 can laterally surround a gate stack structure (50, 52, 58). A sidewall of the cavity 3C in the second device region 200 is vertically coincident with an outer sidewall of the gate spacers 56 during formation of the cavity 3C in the drain region 3D in the second device region 200. The photoresist layer 67 can be removed, for example, by ashing.

Figure 17:
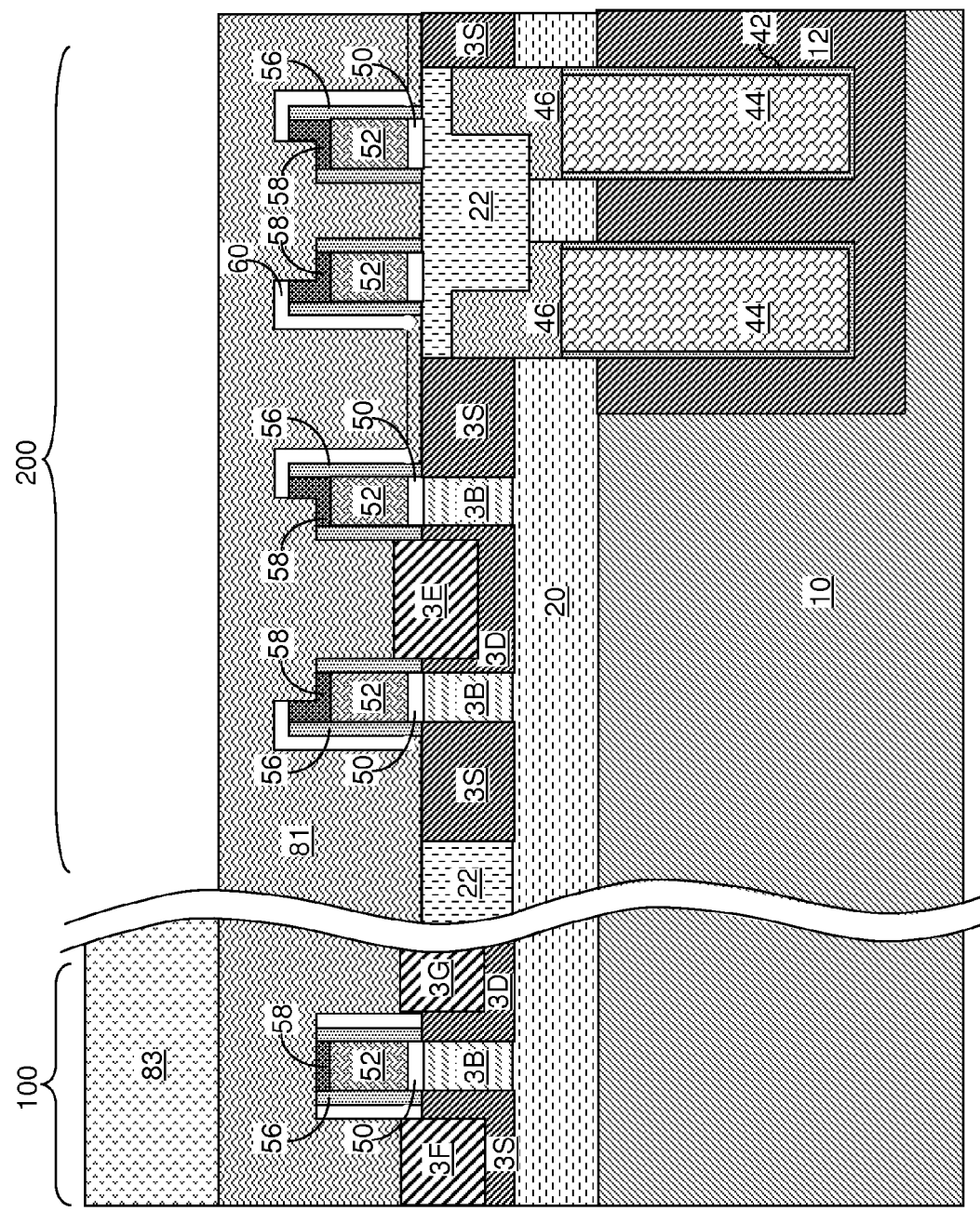
FIG. 17 is a vertical cross-sectional view of the fourth variation of the exemplary semiconductor structure after application of a planarization material layer and application and patterning of a photoresist layer according to an embodiment of the present disclosure.

Referring to FIG. 17, a selective epitaxy process can be performed to form various stress structures (3E, 3F, 3G). Specifically, a stressor structure 3E is formed within each cavity 3C in the second device region 200. A source-side stressor structure 3F is formed within each cavity 3C' within a source region 3S in the first device region 100, and a drain-side stressor structure 3G is formed within each cavity 3C' within a drain region 3D in the first device region 200. The various stressor structures (3E, 3F, 3G) can be formed by deposition of a second semiconductor material that is different from the first semiconductor material, i.e., the semiconductor material of the semiconductor material portions (3S, 3D, 3B). The second semiconductor material can be deposited by selective epitaxy, in which the second semiconductor material is deposited on semiconductor surfaces, and is not deposited on dielectric surfaces such as the surfaces of the dielectric liner 60, the gate dielectric caps 58, or the gate spacers 56.

The same selective epitaxy process can be employed as the selective epitaxy process employed to form the exemplary structure of FIG. 8. The second semiconductor material in the stressor structures (3E, 3F, 3G) can have a different lattice constant than the first semiconductor material of the semiconductor material portions (3S, 3D, 3B). In the second device region 200, due to the absence of any stressor structure within source regions 3S, the stress applied to the body regions of the access transistors is asymmetric. For each access transistor in the second device region 200, the magnitude of the asymmetric stress is greater at a first interface between the drain region 3D and the body region 3D than at a second interface between the source region 3S and the body region 3B. In contrast, for the field effect transistor(s) in the first device region 100, a source-side stressor structure 3F can be embedded in the source region 3S and a drain-side stressor structure 3G can be embedded in the drain region 3D. In this case, the stress in the body region 3B of a field effect transistor in the first device region 100 can be symmetric. In other words, for a field effect transistor in the first device region 100, the magnitude of the asymmetric stress can be the same at a first interface between the drain region 3D and the body region 3D and at a second interface between the source region 3S and the body region 3B.

A planarization material layer 81 is applied over the gate stack structures (50, 52, 58) and the various stressor structures (3E, 3F, 3G). The planarization material layer 81 can include a self-planarizing material that can form a planar top surface. In one embodiment, the planarization material layer can be a self-planarizing material. For example, the self-planarizing material can be an organic planarization material as known in the art, amorphous carbon, spin-on glass, or a combination thereof. In one embodiment, the self-planarizing material can be selected to provide about the same etch resistance to a recess etch as the dielectric liner 60 and/or the gate cap dielectrics 58. In another embodiment, the planarization material layer can be a non-self-planarizing material. In this case, the planarization material layer can be planarized, for example, by chemical mechanical planarization. The top surface of the planarization material layer 81 can be formed above the topmost surfaces of the dielectric liner 60.

Optionally, a photoresist layer 83 can be applied over the planarization dielectric layer 81, and can be patterned to cover the area of the first device region 100, while not covering the area of the second device region 200.

Figure 18:
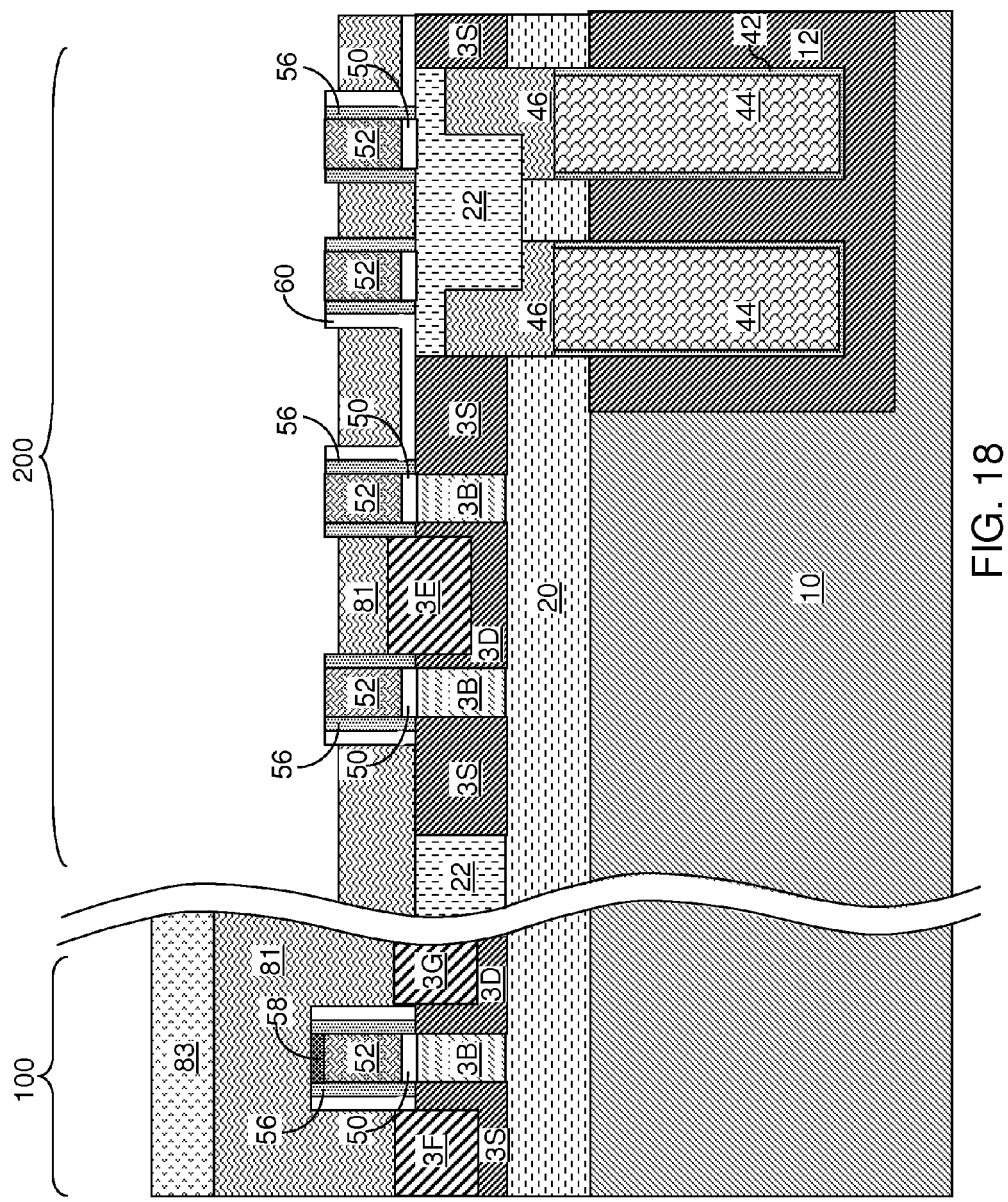
FIG. 18 is a vertical cross-sectional view of the fourth variation of the exemplary semiconductor structure after recessing of the planarization material layer according to an embodiment of the present disclosure.

Referring to FIG. 18, the planarization dielectric layer 81 is recessed by a recess etch, which can include an isotropic etch and/or an anisotropic etch. The top surface of the planarization dielectric layer 81 in the second device region 200 is vertically recessed. During recessing of the planarization dielectric layer 81, dielectric materials above the top surface of the gate electrodes 52 (which include semiconductor material portions) are removed so that the top surfaces of the gate electrodes 52 are physically exposed. The gate spacers 56 and portions of the dielectric liner 60 can be vertically recessed by different degrees during the recessing of the planarization dielectric layer 81. In one embodiment, the chemistry of the recess etch can be selective to the semiconductor material of the gate electrodes 52. In one embodiment, the topmost surfaces of the gate spacers 56 and the topmost surfaces of the remaining portions of the dielectric liner 60 around the gate stack structures (50, 52, 58) in the second device region 200 can be formed at, or above, the horizontal plane including the recessed surface of the planarization dielectric layer 81 in the second device region. The photoresist layer 83 can be collaterally recessed in the first device region 100 during the recessing of the planarization dielectric layer 81.

Figure 19:
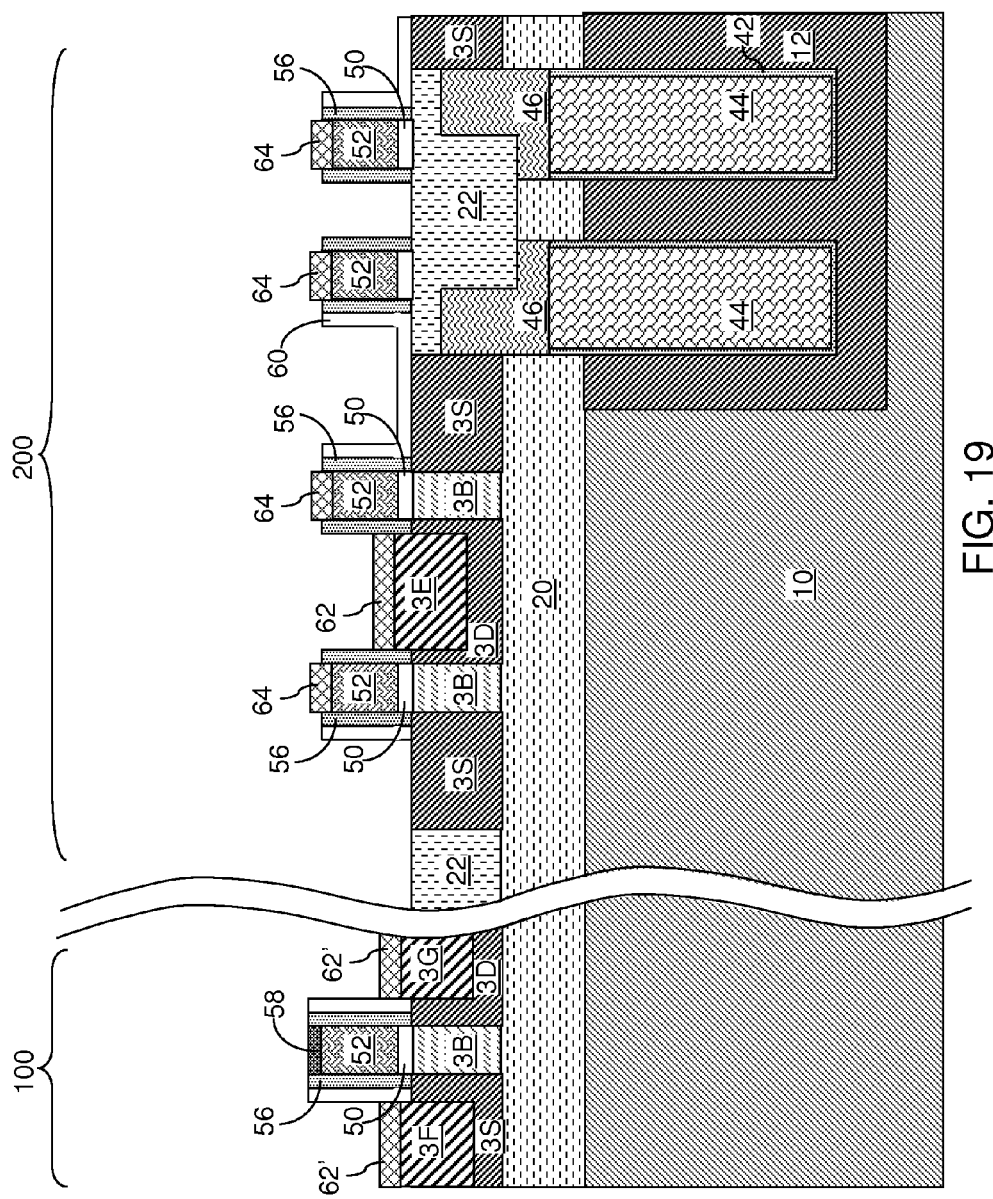
FIG. 19 is a vertical cross-sectional view of the fourth variation of the exemplary semiconductor structure after removal of the planarization material layer and formation of metal semiconductor alloy regions according to an embodiment of the present disclosure.

Referring to FIG. 19, any remaining portion of the photoresist layer 83 and the planarization dielectric layer 81 can be removed, for example, by ashing and/or an etch process that is selective to the first and second semiconductor materials, the semiconductor material of the gat electrodes 52, and the dielectric materials of the dielectric liner 60 and the gate spacers 56, and optionally to the dielectric material of the gate cap dielectric(s) 58. Various metal semiconductor alloy regions (62, 64, 62') can be formed on semiconductor surfaces. The same processing steps can be employed as the processing steps corresponding to FIG. 10. In one embodiment, the metal semiconductor alloy regions (62, 64, 62') can include drain metal semiconductor alloy regions 62 formed directly on the stressor structure 3E, gate metal semiconductor alloy regions 64 formed directly on the gate electrodes 52, and source/drain metal semiconductor alloy regions 62' formed directly on the source-side stressor structure 3F and the drain-side stressor structure 3G.

Figure 20:
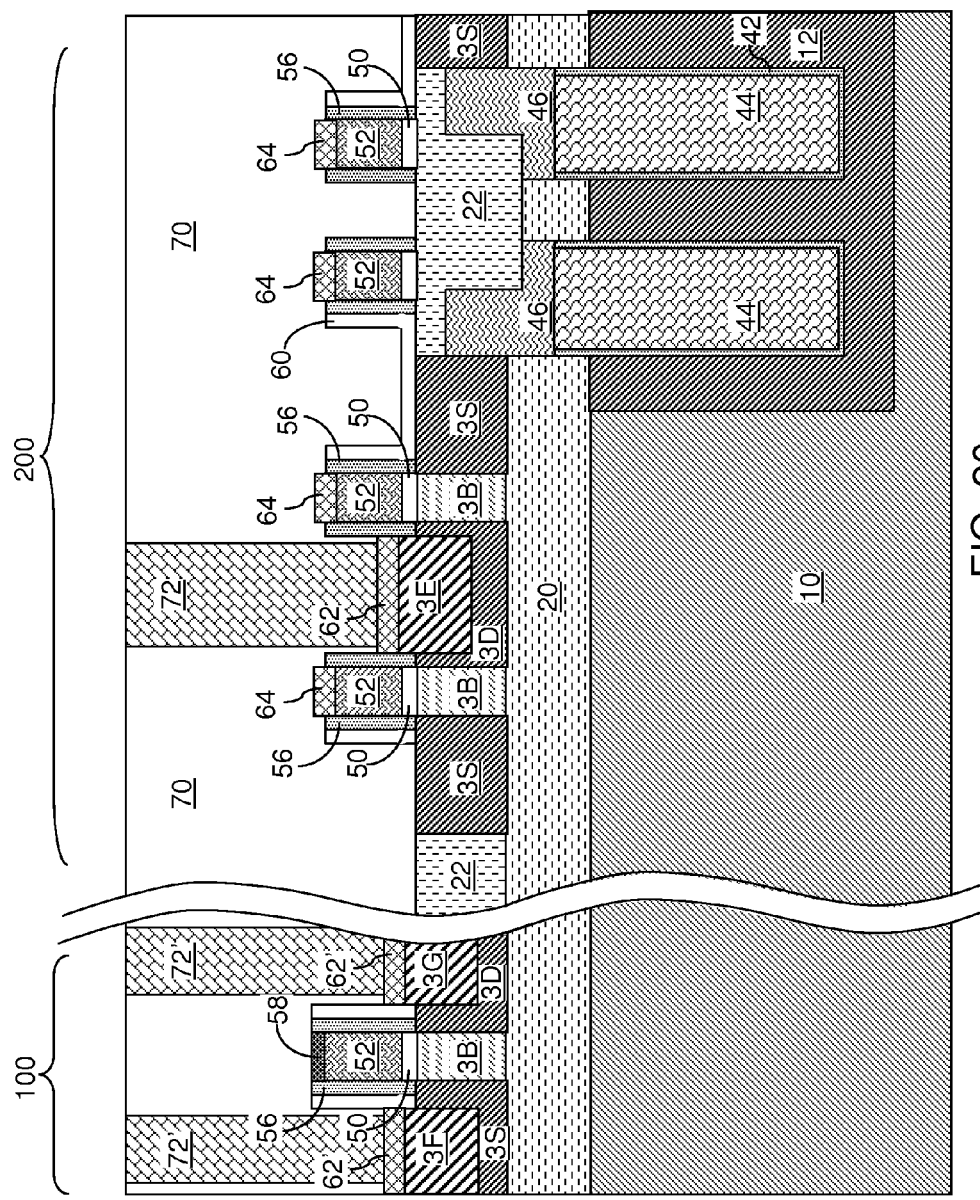
FIG. 20 is a vertical cross-sectional view of the fourth variation of the exemplary semiconductor structure after formation of a contact level dielectric layer and contact via structures according to an embodiment of the present disclosure.

Referring to FIG. 20, a contact level dielectric layer 70 and various contact via structures (72, 72') can be formed employing the same type of processing steps as the processing steps of FIG. 11. The various contact via structures (72, 72') can include a drain contact via structure 72 contacting the drain metal semiconductor alloy region 62 and electrically shorted to the stressor structure 3E, gate contact via structures (not shown) that provide electrical contact to the gate electrodes 52, and source/drain contact via structures 72' that provide electrical contact to the source and drain regions (3S, 3D) in the first device region 100.

The fourth variation of the exemplary semiconductor structure includes at least a trench capacitor (12, 42, 44) embedded within a semiconductor substrate, an access field effect transistor including a source region 3S and a drain region 3D, a stressor structure 3E embedded within the drain region 3D, and a dielectric liner 60 contacting the top surface of the source region 3S and not extending into any area directly overlying the drain region 3D or the stressor structure 3E. The source region 3S is electrically shorted to an inner electrode 44 of the trench capacitor (12, 42, 44). The stressor structure 3E generates a uniaxial stress along the direction of current flow within the body region 3B. The stressor structure 3E generates asymmetric stress across the body region 3B of the access field effect transistor. The magnitude of the asymmetric stress is greater at a first interface between the drain region 3D and the body region 3B than at a second interface between the source region 3S and the body region 3B.

In one embodiment, the source region 3S and the drain region 3B for each access transistor can include a first semiconductor material, and the stressor structure 3E can include a second semiconductor material having a different lattice constant than the first semiconductor material. A drain metal semiconductor alloy region 62 including a metal semiconductor alloy of a metal and a semiconductor material of the stressor structure 3E can be present over the stressor structure 3E.

A gate spacer 56 laterally surrounds a gate electrode 52 of each access field effect transistor. A sidewall of the stressor structure 3E can contact a sidewall of the gate spacer 56. A dielectric liner 60 contacts the contacting the top surface of the source region 3S and the top surface of the shallow trench isolation structure 22. In one embodiment, the dielectric liner 60 does not have any surface that contacts any surface of the drain metal semiconductor alloy region 62. In one embodiment, a dielectric liner 60 can contact a first portion of the gate spacer 56 located on the source side, and does not contact a second portion of the gate spacer 56 located on the drain side or any portion of the drain metal semiconductor alloy region 62.

While an embodiment in which metal semiconductor alloy regions are not formed directly on the gate electrode(s) 52 in the first device region 100, embodiments are expressly contemplated herein in which metal semiconductor alloy regions are not formed directly on the gate electrode(s) 52 in the first device region 100. Such embodiments can be enabled by not forming the photoresist layer 83 at the processing steps of FIG. 17.

Figure 21:
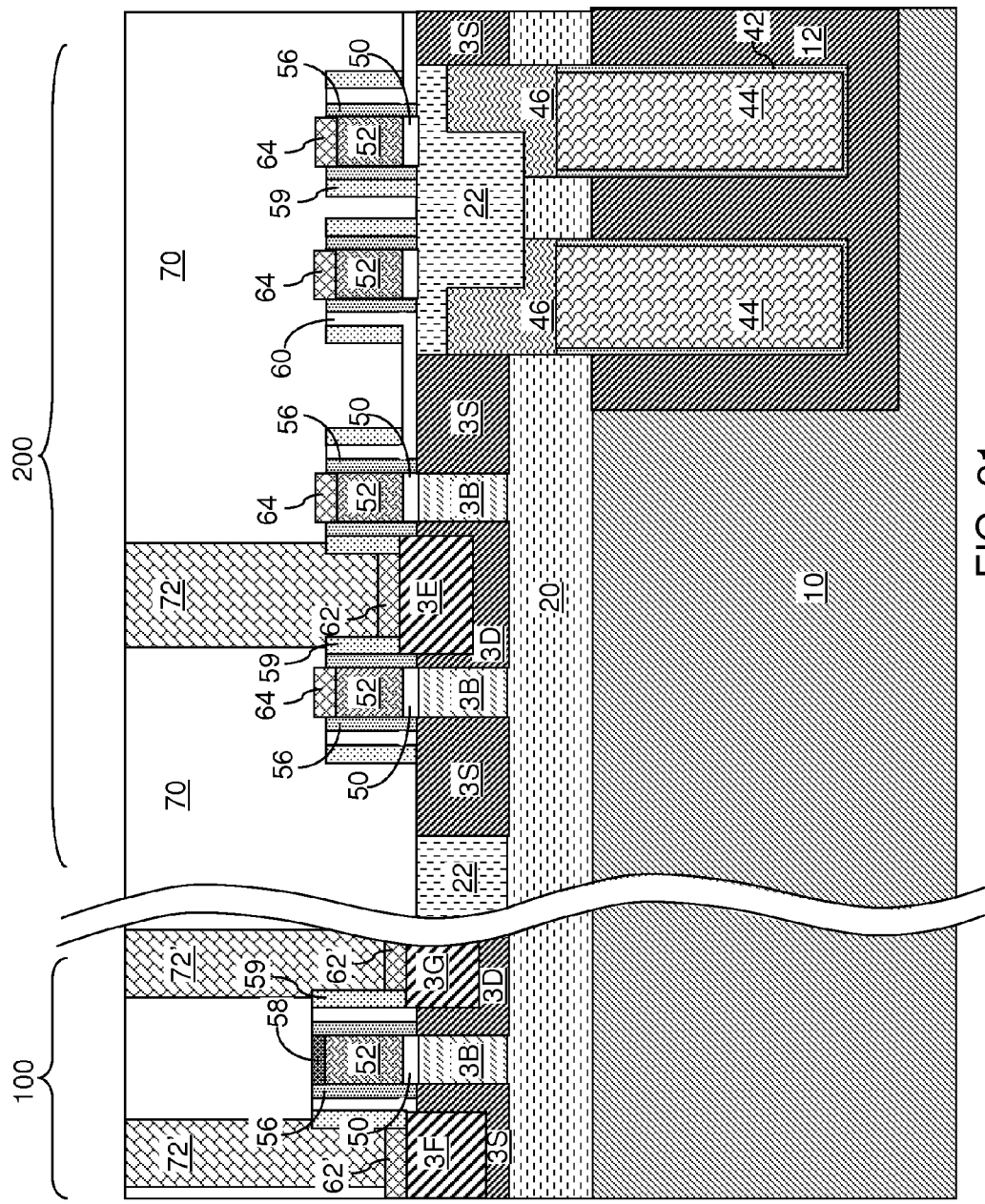
FIG. 21 is a vertical cross-sectional view of a fifth variation of the exemplary semiconductor structure after formation of a contact level dielectric layer and contact via structures according to an embodiment of the present disclosure.

Referring to FIG. 21, a fifth variation of the exemplary semiconductor structure according to an embodiment of the present disclosure can be derived from the fourth variation of the exemplary semiconductor structure by forming outer gate spacers 59 after removal of the photoresist layer 83 and the planarization material layer 81 after the processing steps of FIG. 18, and prior to formation of the various metal semiconductor alloy regions (62, 64, 62'). In this case, the lateral extent of the drain metal semiconductor alloy region 62 and the source/drain metal semiconductor alloy regions 62' can be limited by the outer sidewalls of the outer gate spacers 59. In this case, an outer gate spacer 59 can be in contact with an outer sidewall of the gate spacer 56, a top surface of the stressor structure 3E, and a sidewall of the drain metal semiconductor alloy region 62.

While the disclosure has been described in terms of specific embodiments, it is evident in view of the foregoing description that numerous alternatives, modifications and variations will be apparent to those skilled in the art. Each of the embodiments described herein can be implemented individually or in combination with any other embodiment unless expressly stated otherwise or clearly incompatible. Accordingly, the disclosure is intended to encompass all such alternatives, modifications and variations which fall within the scope and spirit of the disclosure and the following claims.

What is claimed is:

1. A method of forming a semiconductor structure comprising:
    forming a capacitor in a semiconductor substrate;
    forming an access transistor on said semiconductor substrate, wherein a source region of said access transistor is electrically shorted to an inner electrode of said capacitor, and a gate stack structure of said access transistor comprises a gate dielectric, a semiconductor material portion, and a gate dielectric cap;
    concurrently recessing a cavity in said drain region and a first portion of said gate dielectric cap that is proximal to a drain region, while a second portion of said gate dielectric cap that is distal from said drain region is not recessed; and
    forming a stressor structure within said cavity, said stressor structure generating asymmetric stress across a body region of said access field effect transistor.

2. The method of claim 1, further comprising:
    depositing a planarization material layer over remaining portions of said gate dielectric cap after formation of said cavity; and
    simultaneously removing an upper portion of said planarization material layer and said remaining portions of said gate dielectric cap.

3. The method of claim 2, further comprising removing said planarization material layer over said source region, remaining portions of said gate stack structure, and said drain region.

4. The method of claim 3, further comprising forming metal semiconductor alloy regions directly on said stressor structure and said semiconductor material portion, while an entire top surface of said source region contacts dielectric surfaces.

5. The method of claim 1, further comprising:
    forming a dielectric liner over said gate stack structure of said access transistor; and
    removing portions of said dielectric liner from above said drain region and from above said first portion of said gate dielectric cap, while not removing another portion of said dielectric liner from above said second portion of said gate dielectric cap.

6. The method of claim 5, wherein said source region and said drain region comprise a first semiconductor material, and said stressor structure comprises a second semiconductor material having a different lattice constant than said first semiconductor material.

7. The method of claim 5, wherein said dielectric liner covers an entirety of a top surface of said source region while said cavity is formed within said drain region.

8. The method of claim 5, wherein a magnitude of said asymmetric stress is greater at a first interface between said drain region and said body region than at a second interface between said source region and said body region.

9. The method of claim 5, further comprising forming a gate spacer laterally surrounding said gate stack structure prior to formation of said dielectric liner, wherein a sidewall of said cavity is vertically coincident with an outer sidewall of said gate spacer during formation of said cavity.

10. The method of claim 5, further comprising forming a metal semiconductor alloy region by inducing a reaction of a metal with at least a semiconductor material of said stressor structure to form a metal semiconductor alloy.

11. A semiconductor structure comprising:
    a trench capacitor embedded within a semiconductor substrate;
    an access field effect transistor including a source region and a drain region, wherein said source region is electrically shorted to an inner electrode of said trench capacitor;
    a stressor structure embedded within said drain region, said stressor structure generating asymmetric stress across a body region of said access field effect transistor; and
    a dielectric liner contacting a top surface of said source region and not extending into any area directly overlying said drain region or said stressor structure.

12. The semiconductor structure of claim 11, wherein said stressor structure generates a uniaxial stress along a direction of current flow within said body region.

13. The semiconductor structure of claim 11, wherein a magnitude of said asymmetric stress is greater at a first interface between said drain region and said body region than at a second interface between said source region and said body region.

14. The semiconductor structure of claim 11, wherein said source region and said drain region comprise a first semiconductor material, and said stressor structure comprises a second semiconductor material having a different lattice constant than said first semiconductor material.

15. The semiconductor structure of claim 11, further comprising a metal semiconductor alloy region including a metal semiconductor alloy of a metal and a semiconductor material of said stressor structure.

16. The semiconductor structure of claim 15, further comprising a gate spacer laterally surrounding a gate electrode of said access field effect transistor, wherein a sidewall of said stressor structure contacts a sidewall of said gate spacer.

17. The semiconductor structure of claim 16, further comprising another gate spacer in contact with an outer sidewall of said gate spacer and in contact with a top surface of said stressor structure.

18. The semiconductor structure of claim 15, further comprising a dielectric liner contacting a top surface of said source region, wherein said dielectric liner does not have any surface that contacts a top surface of said metal semiconductor alloy region.

19. The semiconductor structure of claim 18, further comprising a gate spacer laterally surrounding a gate electrode of said access field effect transistor, wherein said dielectric liner contact a portion of said gate spacer located on a source side, and does not contact a portion of said gate spacer located on a drain side or said metal semiconductor alloy region.

20. The semiconductor structure of claim 11, further comprising a shallow trench isolation structure in contact with said source region and said a bottom surface of said dielectric liner.

* * * * *